United States Patent
Long et al.

(10) Patent No.: US 12,532,540 B2
(45) Date of Patent: Jan. 20, 2026

(54) DISPLAY PANEL AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Yue Long, Beijing (CN); Cong Liu, Beijing (CN); Yuanyou Qiu, Beijing (CN); Binyan Wang, Beijing (CN); Weiyun Huang, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/746,495

(22) Filed: Jun. 18, 2024

(65) Prior Publication Data

US 2024/0341119 A1    Oct. 10, 2024

Related U.S. Application Data

(63) Continuation of application No. 17/271,398, filed as application No. PCT/CN2020/089600 on May 11, 2020, now Pat. No. 12,048,195.

(51) Int. Cl.
*H10D 86/40* (2025.01)
*H10K 59/121* (2023.01)
(Continued)

(52) U.S. Cl.
CPC ......... *H10D 86/441* (2025.01); *H10K 59/121* (2023.02); *H10K 59/124* (2023.02);
(Continued)

(58) Field of Classification Search
CPC .... H10D 86/441; H10D 86/481; H10D 86/60; H04M 1/02; H10K 59/121; H10K 59/124; H10K 59/126; H10K 59/65; H10K 59/131
See application file for complete search history.

(56) References Cited

U.S. PATENT DOCUMENTS 10,756,136 B1 *  8/2020  Ma .................. H10H 29/142
11,271,053 B2    3/2022  Liang et al.
(Continued)

FOREIGN PATENT DOCUMENTS

CN    109686773 A    4/2019
CN    110047845 A    7/2019
(Continued)

OTHER PUBLICATIONS

Extended (Supplementary) European Search Report dated Jul. 4, 2023, issued in counterpart EP Application No. 20904250.6. (7 pages).
(Continued)

*Primary Examiner* — Galina G Yushina
(74) *Attorney, Agent, or Firm* — WHDA, LLP

(57) ABSTRACT

A display panel is provided, including a base substrate, pixel units, signal lines, and a light shielding portion. Each pixel unit includes a light-emitting element and a pixel driving circuit. The pixel units include first pixel units in a first display region of the display panel and second pixel units in a second display region of the display panel. The signal lines are electrically connected to pixel driving circuits of the second pixel units respectively. Orthographic projections of at least two of the signal lines on the base substrate are spaced apart from each other by a gap, and an orthographic projection of the light shielding portion on the base substrate covers an orthographic projection of the gap on the base substrate and orthographic projections of the second pixel
(Continued)

units. The light shielding portion includes first light shielding sub-portions arranged in an array along row and column directions.

18 Claims, 21 Drawing Sheets

(51) Int. Cl.
*H10K 59/124* (2023.01)
*H10K 59/126* (2023.01)
*H10K 59/131* (2023.01)
*H10K 59/65* (2023.01)

(52) U.S. Cl.
CPC ......... *H10K 59/126* (2023.02); *H10K 59/131* (2023.02); *H10K 59/65* (2023.02)

(56) References Cited

U.S. PATENT DOCUMENTS

| | | | |
|---|---|---|---|
| 11,404,676 B2 | 8/2022 | Li et al. | |
| 11,411,056 B2 | 8/2022 | Ma et al. | |
| 2010/0273530 A1 | 10/2010 | Jarvis et al. | |
| 2016/0323566 A1* | 11/2016 | Vdovin | G02B 30/29 |
| 2017/0278457 A1 | 9/2017 | Zhu et al. | |
| 2017/0372113 A1 | 12/2017 | Zhang et al. | |
| 2020/0075695 A1 | 3/2020 | Zhao et al. | |
| 2020/0303487 A1* | 9/2020 | Shin | G09G 3/3266 |
| 2020/0343312 A1* | 10/2020 | Ryu | H10K 59/8792 |
| 2021/0159286 A1* | 5/2021 | Ma | H10K 59/126 |
| 2021/0202621 A1* | 7/2021 | Liang | H10K 59/124 |
| 2021/0376047 A1* | 12/2021 | Xue | H10K 59/131 |
| 2022/0140040 A1 | 5/2022 | Zhang et al. | |

FOREIGN PATENT DOCUMENTS

| | | |
|---|---|---|
| CN | 110061014 A | 7/2019 |
| CN | 110365819 A | 10/2019 |
| CN | 110520919 A | 11/2019 |
| CN | 110618557 A | 12/2019 |
| CN | 110634930 A | 12/2019 |
| CN | 110767739 A | 2/2020 |
| CN | 110867476 A | 3/2020 |
| CN | 111129102 A | 5/2020 |
| JP | 2003-157029 A | 5/2003 |

OTHER PUBLICATIONS

Non-Final Office Action dated Dec. 7, 2023, issued in U.S. Appl. No. 17/271,398 (31 pages).
Notice of Allowance dated Mar. 19, 2024, issued in U.S. Appl. No. 17/271,398 (10 pages).
ISR and Written Opinion of PCT International application No. PCT/CN2020/089600 dated Feb. 18, 2021 with English translation. (19 pages).
Office Action dated Mar. 11, 2025, issued in counterpart CN Application No. 202080000709.5, with English translation. (26 pages).

* cited by examiner

Related Art

DISPLAY PANEL AND DISPLAY DEVICE

CROSS-REFERENCE TO RELATED APPLICATION

This application is a continuous application of U.S. application Ser. No. 17/271,398, file Feb. 25, 2021, entitled "DISPLAY PANEL AND DISPLAY DEVICE", which is a Section 371 National Stage Application of International Application No. PCT/CN2020/089600, filed on May 11, 2020, entitled "DISPLAY PANEL AND DISPLAY DEVICE", which are incorporated herein by reference in their entirety.

TECHNICAL FIELD

The present disclosure relates to the field of display technologies, and in particular to a display panel and a display device.

BACKGROUND

With the increase of user's demands for diversified use of display devices and the emergence of design requirements for high screen-to-body ratios of display devices, an "under-screen camera" solution has emerged. In the "under-screen camera" solution, imaging modules such as cameras are embedded in the display region to reduce a size of a frame region of the display device, thereby increasing the screen-to-body ratio. At present, in the "under-screen camera" solution, on the basis of increasing the screen-to-body ratio of the display device, it has become an important project concerned by the researchers that how to ensure a light transmittance at a location of the display panel where the imaging module is correspondingly provided and an imaging effect of the imaging module.

The above information disclosed in this section is merely for the understanding of the background of the technical concept of the present disclosure, therefore, the above information may include information that does not constitute the prior art.

SUMMARY

In one aspect, a display panel is provided, including: a base substrate: a plurality of pixel units arranged on the base substrate in an array, wherein each pixel unit includes a pixel driving circuit and a light-emitting element, and the pixel driving circuit is configured to drive the light-emitting element; a plurality of signal lines, the plurality of signal lines being electrically connected to the pixel driving circuit, respectively; and a light shielding portion on the base substrate, wherein orthographic projections of at least two ones of the plurality of signal lines on the base substrate are spaced apart from each other by a gap, at least one of interference and diffraction is generated due to a plurality of gaps in response to that at least a part of light passes through the plurality of gaps, and an orthographic projection of the light shielding portion on the base substrate covers at least orthographic projections of the plurality of gaps on the base substrate.

According to some exemplary embodiments, the display panel includes a first display region and a second display region, the first display region has a first pixel density, the second display region has a second pixel density, and the first pixel density is larger than the second density; and the orthographic projection of the light shielding portion on the base substrate at least falls within an orthographic projection of the second display region on the base substrate.

According to some exemplary embodiments, the plurality of gaps include a first gap and a second gap, the first gap is located inside the pixel units in the second display region, and the second gap is located between any two ones of the pixel units in the second display region; and the orthographic projection of the light shielding projection on the base substrate covers an orthographic projection of each of the first gap and the second gap on the base substrate.

According to some exemplary embodiments, the pixel driving circuit includes a storage capacitor and at least one thin film transistor, each thin film transistor includes an active layer, a gate electrode, a source electrode and a drain electrode, the storage capacitor includes a first capacitor electrode and a second capacitor electrode; the light-emitting element includes an anode; the display panel further includes a conductive connecting portion, and the conductive connecting portion is configured to electrically connect one of the source electrode and the drain electrode to the anode; and the display panel includes: a first conductive layer on a side of the active layer away from the base substrate, wherein the gate electrode and the second capacitor electrode are located in the first conductive layer; a second conductive layer on a side of the first conductive layer away from the base substrate, wherein the first capacitor electrode is located in the second conductive layer; a third conductive layer on a side of the second conductive layer away from the base substrate, wherein the source electrode and the drain electrode are located in the third conductive layer; and a fourth conductive layer on a side of the third conductive layer away from the base substrate, wherein the conductive connecting layer is located in the fourth conductive layer.

According to some exemplary embodiments, the light shielding portion is located in a layer different from all of the first conductive layer, the second conductive layer, the third conductive layer and the fourth conductive layer.

According to some exemplary embodiments, the plurality of signal lines include at least a driving voltage line configured to supply a power voltage signal, the driving voltage line is located in the third conductive layer, and the light shielding portion is electrically connected to the driving voltage line.

According to some exemplary embodiments, the display panel further includes: a gate insulating layer between the active layer and the first conductive layer; a first interlayer insulating layer between the first conductive layer and the second conductive layer; a second interlayer insulating layer between the second conductive layer and the third conductive layer; a first planarization layer between the third conductive layer and the fourth conductive layer; and a second planarization layer between the fourth conductive layer and the anode.

According to some exemplary embodiments, the light shielding portion is located between the active layer and the base substrate.

According to some exemplary embodiments, the orthographic projection of the light shielding portion on the base substrate covers orthographic projections of various pixel units in the second display region on the base substrate, and also covers orthographic projections of portions of the plurality of signal lines in the second display region on the base substrate.

According to some exemplary embodiments, the light shielding portion extends continuously in the second display region.

According to some exemplary embodiments, a profile of the orthographic projection of the light shielding portion on the base substrate has an arc-shaped boundary line; and/or a profile of the orthographic projection of the light shielding portion on the base substrate has an arc-shaped transition portion at corners.

According to some exemplary embodiments, the display panel further includes a plurality of light transmittance regions in the second display region, orthographic projections of the plurality of light transmittance regions on the base substrate do not overlap the orthographic projection of the light shielding portion on the base substrate, and an orthographic projection of each of the plurality of light transmittance regions on the base substrate has a rectangular shape with rounded corners.

According to some exemplary embodiments, a profile of an orthographic projection of a part of the light shielding portion for shielding each pixel unit in the second display region on the base substrate has an approximately rectangular shape, and the approximately rectangular shape has an arc-shaped transition at each of four corners.

According to some exemplary embodiments, the display panel includes: a first buffer layer on the base substrate; and a second buffer layer between the first buffer layer and the active layer, wherein the light shielding portion is located between the first buffer layer and the second buffer layer.

According to some exemplary embodiments, the light shielding portion is located in the fourth conductive layer.

According to some exemplary embodiments, the orthographic projection of the light shielding portion on the base substrate is spaced apart from an orthographic projection of the conductive connecting portion on the base substrate by an interval.

According to some exemplary embodiments, the orthographic projection of the light shielding portion on the base substrate surrounds an orthographic projection of the anode on the base substrate, and the orthographic projection of the light shielding portion on the base substrate is spaced apart from the orthographic projection of the anode on the base substrate by an interval.

According to some exemplary embodiments, the light shielding portion includes a first light shielding portion and a second light shielding portion, the first light shielding portion is located between the active layer and the base substrate, and the second light shielding portion is located in the fourth conductive layer.

According to some exemplary embodiments, the display panel further includes a conductive transfer portion, and the conductive transfer portion is located in the first conductive layer; the driving voltage line is electrically connected to the conductive transfer portion through a first via hole penetrating both the first interlayer insulating layer and the second interlayer insulating layer; and the conductive transfer portion is electrically connected to the light shielding portion through a second via hole penetrating both the gate insulating layer and the second buffer layer.

According to some exemplary embodiments, the light shielding portion is electrically connected to the driving voltage line through a third via hole penetrating the first planarization layer.

According to some exemplary embodiments, the plurality of signal lines include a scanning signal line, a light-emitting control line, a data line, a driving voltage line, an initialization voltage line and a power supply line.

According to some exemplary embodiments, the scanning signal line, the light-emitting control line and the initialization voltage line are arranged in a row direction, the data line and the driving voltage line are arranged in a column direction, each of the scanning signal line, the light-emitting control line, the initialization voltage line, the data line and the driving voltage line includes a first portion inside the pixel unit and a second portion between two adjacent pixel units, the plurality of gaps include a first gap, the first gap is formed between any two ones of the first portions of the scanning signal line, the light-emitting control line, the initialization voltage line, the data line and the driving voltage line, and the orthographic projection of the light shielding portion on the base substrate at least covers an orthographic projection of the first gap on the base substrate.

According to some exemplary embodiments, the scanning signal line for the pixel units in the first display region includes an signal line extension portion passing through the second display region in the row direction, a second gap is formed between any two ones of the signal line extension portion and the second portions of the scanning signal line, the light-emitting control line and the initialization voltage line, and the orthographic projection of the light shielding portion on the base substrate also at least covers an orthographic projection of the second gap on the base substrate.

In another aspect, a display device is provided, including: the display panel as described above; and an image sensor, wherein the image sensor is located on a side of the base substrate away from the light shielding portion, and an orthographic projection of the image sensor on the base substrate falls within the orthographic projection of the second display region on the base substrate.

BRIEF DESCRIPTION OF THE DRAWINGS

Features and advantages of the present disclosure will become more apparent through embodiments of the present disclosure described with reference to the drawings.

DETAILED DESCRIPTION OF EMBODIMENTS

Figure 1:
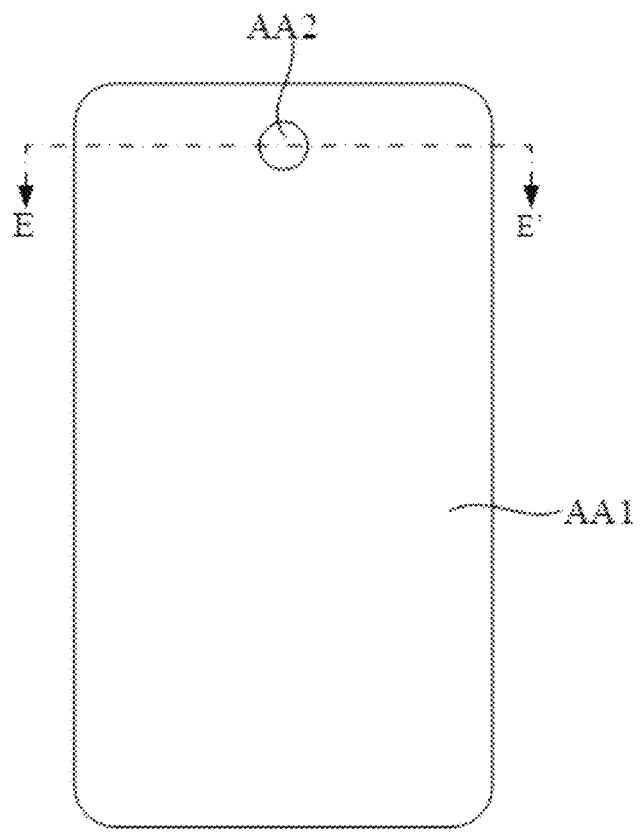
FIG. 1 is a schematic plane view of the display panel according to some exemplary embodiments of the present disclosure.

In order to make objectives, technical solutions, and advantages of embodiments of the present disclosure clearer, the technical solutions of the embodiments of the present disclosure will be described clearly and completely in conjunction with the accompanying drawings. Obviously, the described embodiments are part of the embodiments of the present disclosure, rather than all of the embodiments. Based on the described embodiments of the present disclosure, all other embodiments obtained by those skilled in the art without creative work fall within the protection scope of the present disclosure.

It should be noted that, in the drawings, for clarity and/or description purposes, the size and relative size of elements may be enlarged. As such, the size and relative size of each element need not be limited to those shown in the drawings. In the specification and drawings, the same or similar reference numerals indicate the same or similar components.

When an element is described as being "on", "connected to" or "coupled to" another element, the element may be directly on the other element, directly connected to the other element or directly coupled to the other element, or an intervening element may be present. However, when an element is described as being "directly on", "directly connected to" or "directly coupled to" another element, there is no intervening element. Other terms and/or expressions used to describe the relationship between elements should be interpreted in a similar manner, for example, "between" and "directly between", "adjacent" and "directly adjacent" "or "above" and "directly above" etc. In addition, the term "connected" may refer to a physical connection, an electrical connection, a communication connection, and/or a fluid connection. In addition, the X axis, the Y axis, and the Z axis are not limited to the three axes of the Cartesian coordinate system, and may be interpreted in a broader meaning. For example, the X axis, Y axis, and Z axis may be perpendicular to each other, or may represent different directions that are not perpendicular to each other. For the purpose of the present disclosure, "at least one of X, Y, and Z" and "at least one selected from the group consisting of X, Y, and Z" may be interpreted as only X, only Y, only Z, or any combination of two or more of X, Y, and Z such as XYZ, XYY, YZ, and ZZ. As used herein, the term "and/or" includes any and all combinations of one or more of the listed related items.

It should be noted that although the terms "first", "second", etc. may be used herein to describe various components, members, elements, regions, layers and/or portions, these components, members, elements, regions, and layers and/or portions should not be limited by these terms. Rather, these terms are used to distinguish one component, member, element, region, layer, and/or portion from another one. Thus, for example, the first component, the first member, the first element, the first region, the first layer, and/or the first portion discussed below may be referred to as the second component, the second member, the second element, the second region, the second layer and/or the second portion without departing from the teaching of the present disclosure.

For ease of description, spatial relationship terms, for example, "upper", "lower", "left", "right", etc. may be used herein to describe the relationship between one element or feature and another element or feature as shown in the drawings. It should be understood that the spatial relationship terms are intended to cover other different orientations of the device in use or operation in addition to the orientations described in the drawings. For example, if the device in the drawings is turned upside down, the element described as being "below" or "beneath" other elements or features will be oriented "above" or "on" the other elements or features.

Those skilled in the art should understand that in this text, unless otherwise specified, an expression "height" or "thickness" refers to a size in a direction perpendicular to a surface of respective film layers arranged on the display panel, that is, the size in a light-emitting direction of the display panel, or may be referred to as a size in the normal direction of the display device or a size in the Z direction in the drawings.

In this text, an expression "pixel density" refers to the number of pixel units or sub-pixel units per unit area.

In this text, expressions "row direction" and "column direction" refer to two directions in which pixel units or sub-pixels are arranged in an array, it should be understood that the "row direction" and "column direction" are two directions crossing each other, which may be two directions perpendicular to each other, and may also be two directions that form an angle different from 90°.

The embodiments of the present disclosure provide at least a display panel, including: a base substrate: a plurality of pixel units arranged on the base substrate in an array, wherein each pixel unit comprises a pixel driving circuit and a light-emitting element, and the pixel driving circuit is configured to drive the light-emitting element; a plurality of signal lines, the plurality of signal lines being electrically connected to the pixel driving circuit, respectively; and a light shielding portion on the base substrate, wherein orthographic projections of at least two ones of the plurality of signal lines on the base substrate are spaced apart from each other by a gap, at least one of interference and diffraction is generated due to a plurality of gaps in response to that at least a part of light passes through the plurality of gaps, and an orthographic projection of the light shielding portion on the base substrate covers at least orthographic projections of the plurality of gaps on the base substrate. By providing the light shielding portion, the diffraction and interference of the light for imaging may be avoided, so that a brightness change in a local region in the field of view may be reduced, and the visibility of an object may be increased. In this way, a glare phenomenon of the under-screen camera may be effectively eliminated, and the imaging effect may be increased.

Figure 2:
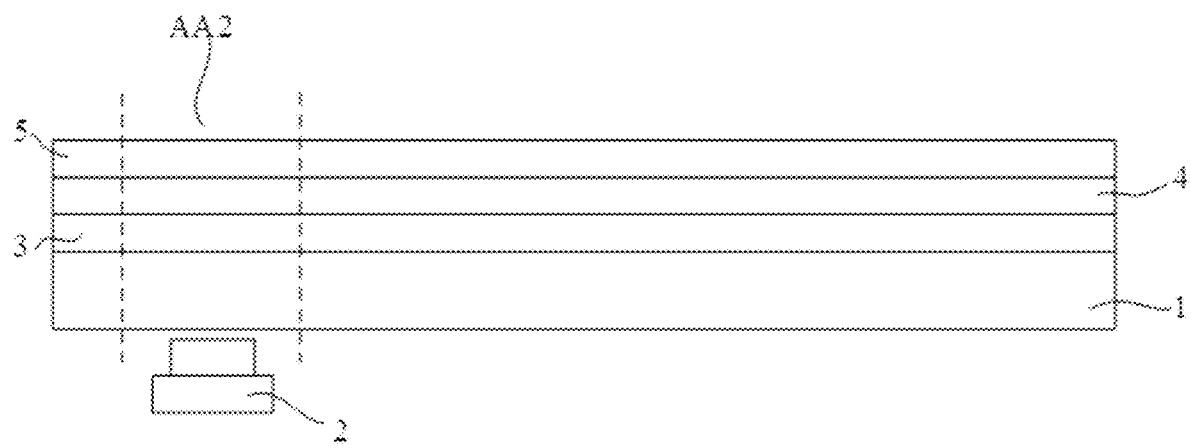
FIG. 2 is a schematic cross-sectional view of the display panel according to some exemplary embodiments of the present disclosure taken along line EE' in FIG. 1.
Figure 3:
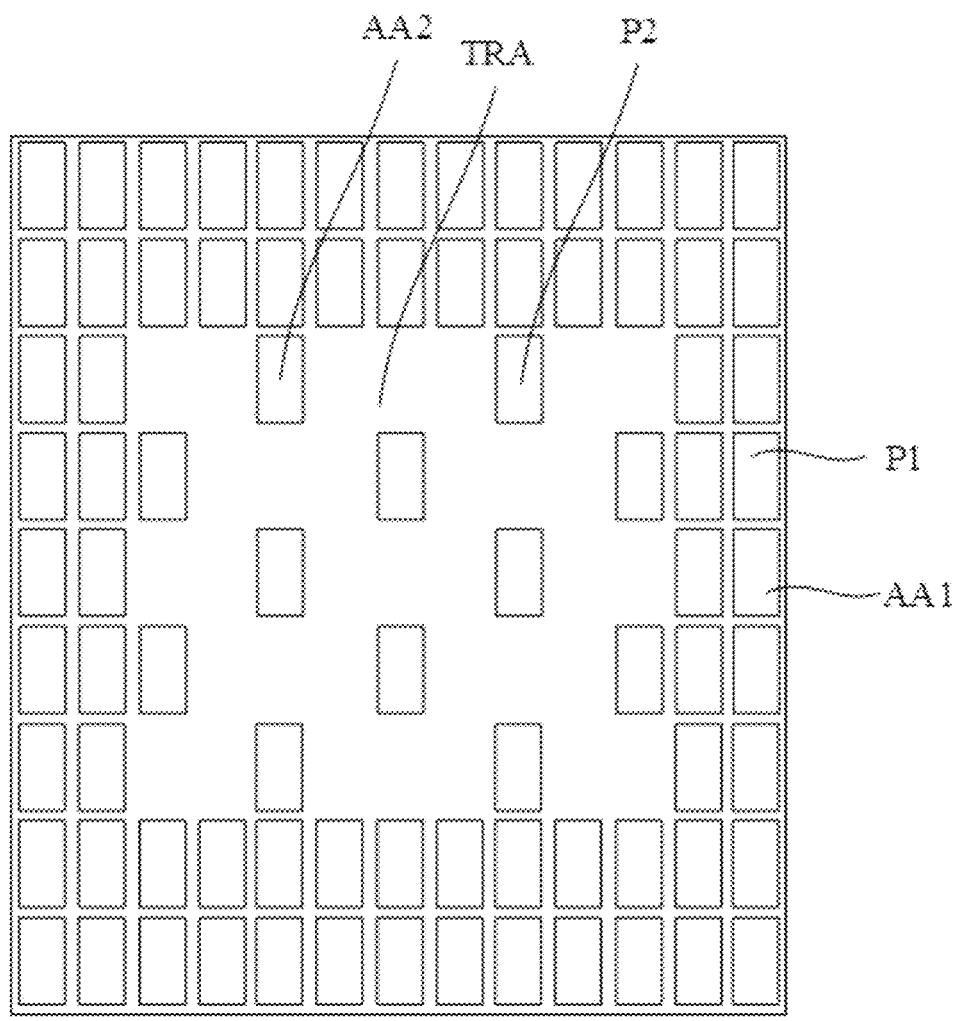
FIG. 3 is a schematic partial enlarged view of the display panel in FIG. 1, wherein each rectangular represents a pixel unit.

FIG. 1 is a schematic plan view of a display panel according to some exemplary embodiments of the present disclosure. FIG. 2 is a schematic cross-sectional view of the display panel according to some exemplary embodiments of the present disclosure taken along line EE' in FIG. 1. FIG. 3 is a schematic partial enlarged view of the display panel in FIG. 1, in which each rectangle represents a pixel unit.

With reference to FIG. 1 to FIG. 3, the display panel includes a first display region AA1 and a second display region AA2 at least partially surrounded by the first display region AA1. The first display region AA1 includes a plurality of first pixel units P1 arranged in an array, and the second display region AA2 includes a plurality of second pixel units P2 arranged in an array. The first pixel units P1 may further include a plurality of sub-pixel units, such as a red sub-pixel unit, a green sub-pixel unit, and a blue sub-pixel unit; similarly, the second pixel units P2 may further include a plurality of sub-pixel units, such as a red sub-pixel unit, a green sub-pixel unit, and a blue sub-pixel unit.

As shown in FIG. 3, the first display region AA1 has a first pixel density, and the second display region AA2 has a second pixel density smaller than the first pixel density.

In the second display region AA2, a blank region between the plurality of second pixel units P2 may allow more light to pass through, thereby increasing a light transmittance of the region. Therefore, the second display region AA2 has a greater light transmittance than the first display region AA1.

It should be noted that, in this text, the blank region between the plurality of second pixel units P2 may be referred to as a light transmittance region TRA.

As shown in FIG. 2, the display panel may include a base substrate 1. An image sensor 2 may be arranged on a back side (shown as the lower side in FIG. 2) of the base substrate 1 in the second display region AA2, and the second display region AA2 may meet imaging requirements of the image sensor 2 for the light transmittance.

In the display panel shown in FIG. 1 to FIG. 3, OLED display technology may be used. As OLED display panels have advantages of wide viewing angle, high contrast, fast response, low power consumption, foldability, flexibility, etc., they are more and more widely used in display products. With the development and in-depth application of the OLED display technology, the demand for high screen-to-body ratio displays is becoming stronger and stronger. In the display panel shown in FIG. 1 to FIG. 3, an under-screen camera solution is adopted. In this way, a notch region may be eliminated, forming a hole in the display screen may be avoided, and the screen-to-body ratio may be increased, thereby obtaining a better visual experience.

In addition, the display panel may further include a driving circuit layer, a light-emitting element layer, and an encapsulating layer on the base substrate 1. For example, the driving circuit layer 3, the light-emitting element layer 4, and the encapsulating layer 5 are schematically shown in FIG. 2. The driving circuit layer 3 includes a driving circuit structure, the light-emitting element layer 4 includes a light-emitting element such as an OLED. The driving circuit structure controls the light-emitting element of each sub-pixel unit to emit light so as to realize the display function. The driving circuit structure includes thin film transistors, storage capacitors, and various signal lines. The various signal lines include scanning signal lines, data lines, ELVDD power supply lines, ELVSS power supply lines, and the like, so as to provide control signals, data signals, power supply voltages, and the like, for the pixel driving circuit in each sub-pixel unit in the pixel unit.

Figure 4:
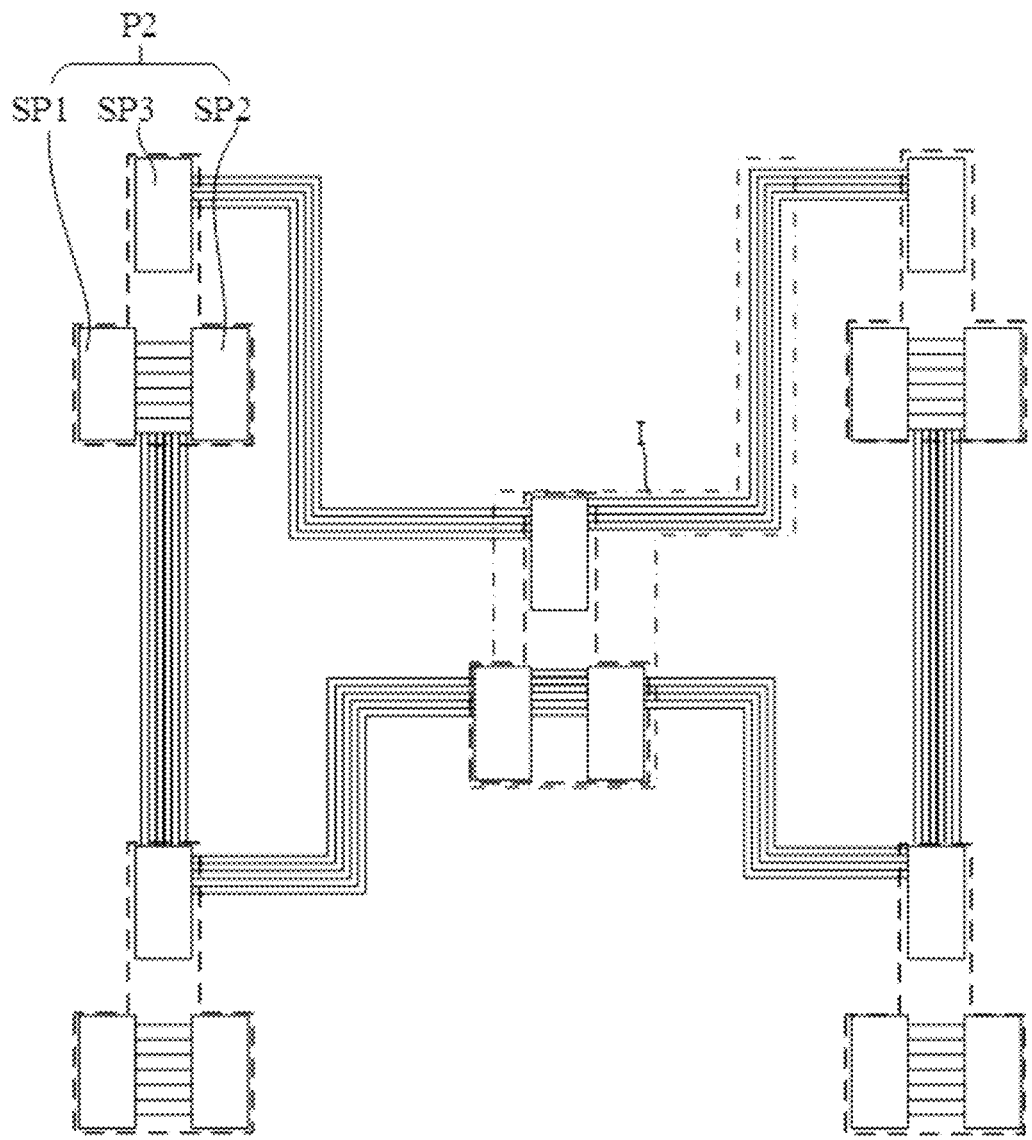
FIG. 4 is a schematic view of a second display region of the display panel in the related art, wherein a plurality of (for example, five) pixel units are shown schematically.

FIG. 4 is a schematic view of the second display region AA2 of the display panel in the related art, in which several (for example, five) pixel units are schematically shown.

As shown in FIG. 4, the second display region AA2 includes a plurality of second pixel units P2 arranged in an array. For example, each second pixel unit P2 may further include a plurality of sub-pixel units, such as a red sub-pixel unit SP1, a green sub-pixel unit SP2, and a blue sub-pixel unit SP3. There is a light transmittance region TRA between the pixel units P2 in the second display region AA2, for allowing the light for imaging to pass through, so that light is incident onto the image sensor 2 provided in the second display region AA2.

It should be noted that, in the drawings, the pixel units and the sub-pixel units are shown schematically in rectangular shape, however, this does not limit the shapes of the pixel units and the sub-pixel units included in the display panel provided in the embodiments of the present disclosure. In addition, in the drawings, the three sub-pixel units SP1, SP2, and SP3 included in each pixel unit SP are arranged in a delta shape, and this arrangement does not limit the display panel according to the embodiments of the present disclosure, either.

In the text, the light for imaging may include at least one of visible light or infrared light, but the embodiments of the present disclosure do not limit this.

Figure 5:
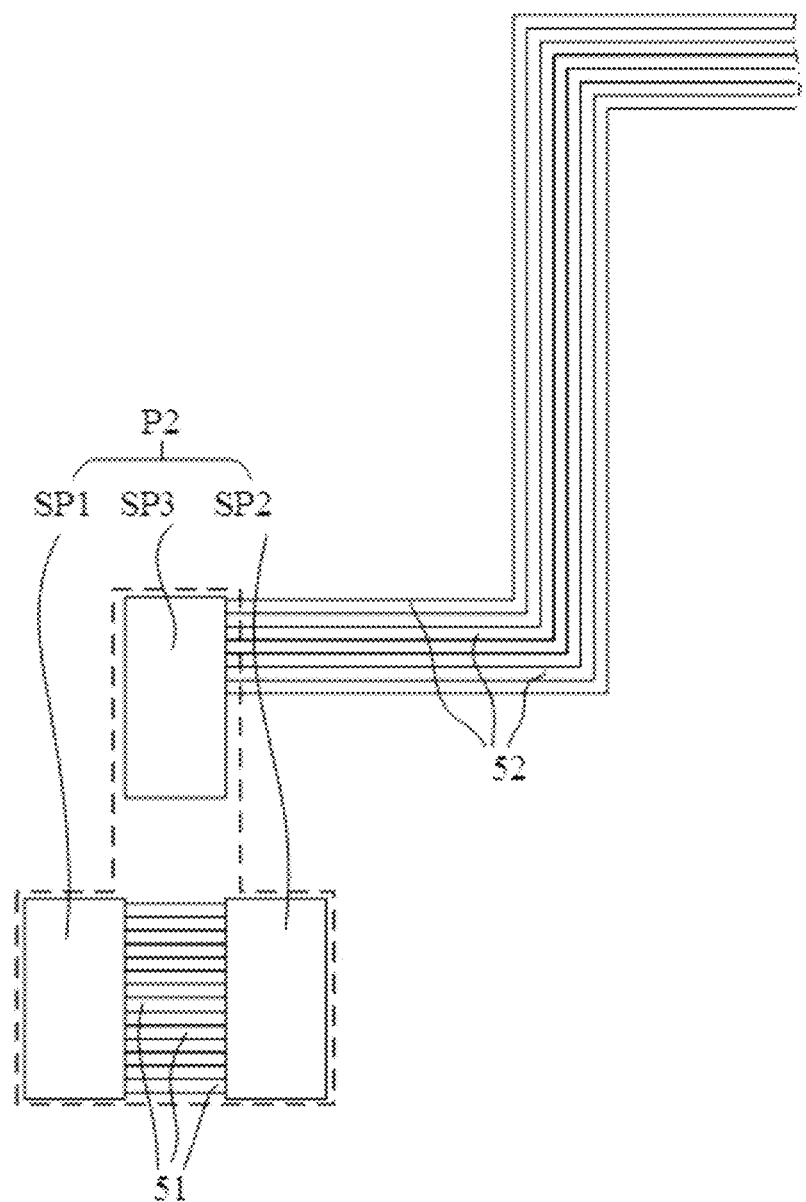
FIG. 5 is a partial enlarged view of section I in FIG. 4.

FIG. 5 is a partial enlarged view of section I in FIG. 4. with reference to FIG. 4 and FIG. 5 in combination, the display panel includes various signal lines that provide signals such as control signals, data signals, and power supply voltages for each sub-pixel unit, for example, the signal lines may include a scanning signal line, a data line, an ELVDD power supply line, an ELVSS power supply line, a reset line, a light-emitting control line, and the like, and these signal lines may be formed in different layers. For example, the scanning signal line may be located in the same layer as a gate electrode of the thin film transistor (for example, formed by the same patterning process), and the data line may be located in the same layer as a source electrode and a drain electrode of the thin film transistor (for example, formed by the same patterning process).

With reference to FIG. 4 and FIG. 5, the various signal lines as described above extend inside each of the various pixel units and between any two ones of the various pixel units. In the second display region AA2, some relatively small gaps are formed between any two ones of various signal lines. These gaps may be formed inside each of the various pixel units, as indicated by gaps 51 shown in FIG. 5; and may also be formed between any two ones of the various pixel units, as indicated by gaps 52 shown in FIG. 5. During imaging, incoming light may pass through these gaps so that single-slit diffraction or double-slit interference may be produced, thereby causing diffraction or interference stripes and then resulting in uneven brightness when the incoming light reaches the camera. As a result, glare (that is, excessive brightness or excessive brightness change occurs in a certain local portion in the field of view) may occur, thereby reducing visibility of an object, which is not beneficial for imaging. That is, such a diffraction or interference may cause a decrease in the image quality of the image sensor 2 located below the second display region AA2.

Hereinafter, some exemplary embodiments of the present disclosure will be described in detail with reference to the accompanying drawings.

For example, the display panel according to some exemplary embodiments of the present disclosure may be an organic light-emitting diode (i.e., OLED) display panel. The display panel may include a plurality of sub-pixel units, and each sub-pixel unit may include a pixel driving circuit for controlling the sub-pixel units to perform light-emitting display.

Hereinafter, by taking 7T1C pixel driving circuit as an example, a structure of the pixel driving circuit will be described in detail. However, the embodiments of the present disclosure are not limited to the 7T1C pixel driving circuit. Other known structures of pixel driving circuit may be applied to the embodiments of the present disclosure without conflict.

Figure 6:
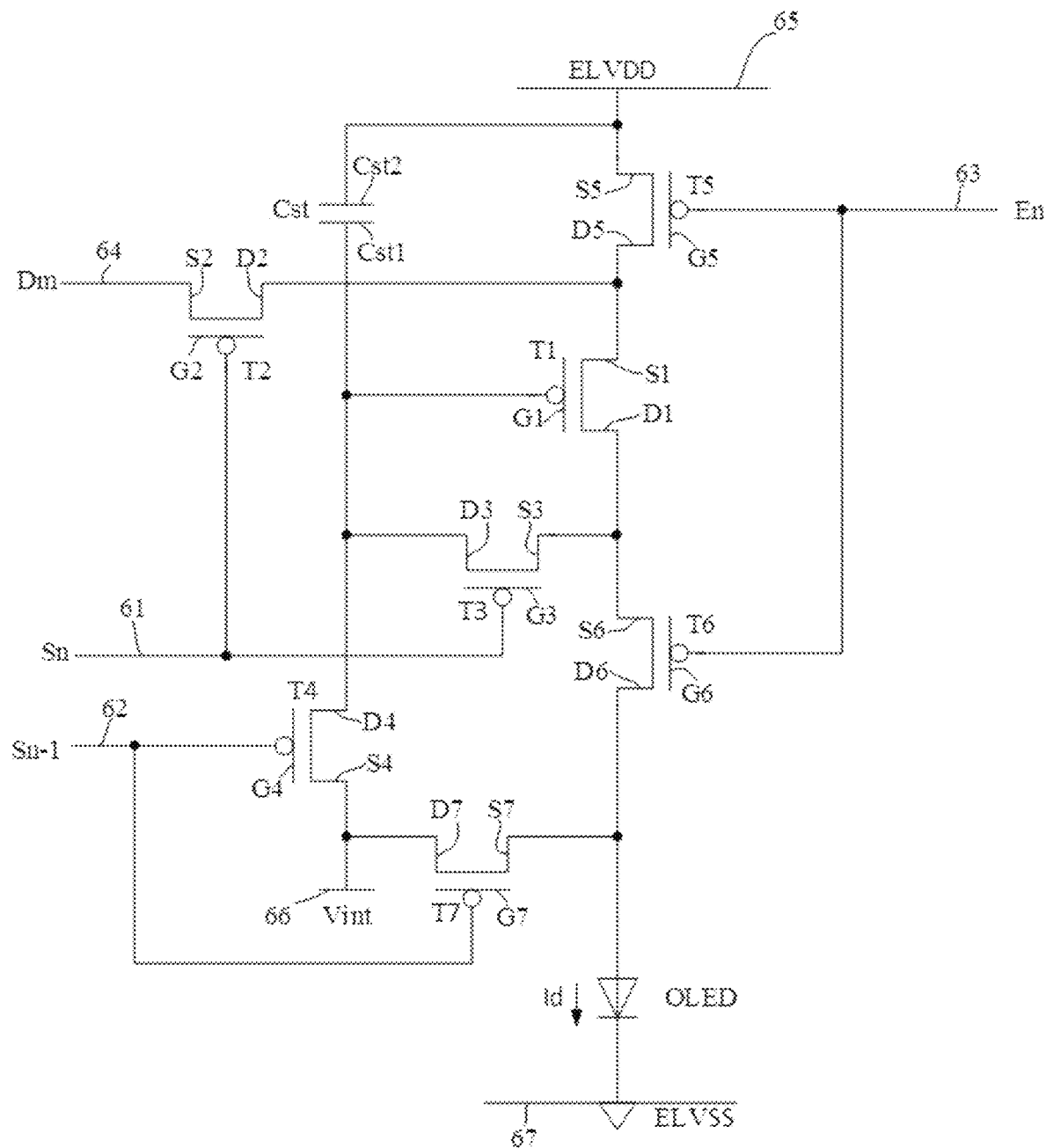
FIG. 6 is an equivalent circuit diagram of a pixel driving circuit of the display panel according to some exemplary embodiments of the present disclosure.

FIG. 6 is an equivalent circuit diagram of a pixel driving circuit of the display panel according to some exemplary embodiments of the present disclosure. As shown in FIG. 6, the pixel driving circuit may include: a plurality of signal lines 61, 62, 63, 64, 65, 66 and 67, a plurality of thin film transistors T1, T2, T3, T4, T5, T6 and T7, and a storage capacitor Cst. The pixel driving circuit is used to drive an organic light-emitting diode (i.e., OLED).

The plurality of thin film transistors include a driving thin film transistor T1, a switching thin film transistor T2, a compensating thin film transistor T3, an initialization thin film transistor T4, an operation control thin film transistor T5, a light-emitting control thin film transistor T6, and a bypass thin film transistor T7.

The plurality of signal lines include: a scanning signal line 61 for transmitting a scanning signal Sn, a previous scanning signal line 62 for transmitting a previous scanning signal Sn-1 to the initialization thin film transistor T4, a light-emitting control line 63 for transmitting the light-emitting control signal En to the operation control thin film transistor T5 and the light-emitting control thin film transistor T6, a data line 64 for transmitting the data signal Dm, a driving voltage line 65 for transmitting the driving voltage ELVDD, an initialization voltage line 66 for transmitting an initialization voltage Vint that initializes the driving thin film transistor T1, and a power supply line 67 for transmitting the ELVSS voltage.

A gate electrode G1 of the driving thin film transistor T1 is electrically connected to one end Cst1 (hereinafter referred to as a first capacitor electrode) of the storage capacitor Cst, a source electrode S1 of the driving thin film transistor T1 is electrically connected to the driving voltage line 65 via the operation control thin film transistor T5, a drain electrode D1 of the thin film transistor T1 is electrically connected to an anode of the OLED via the light-emitting control thin film transistor T6. The driving thin film transistor T1 receives the data signal Dm according to a switching operation of the switching thin film transistor T2 to supply driving currents Id to the OLED.

A gate electrode G2 of the switching thin film transistor T2 is electrically connected to the scanning signal line 61, a source electrode S2 of the switching thin film transistor T2 is electrically connected to the data line 64, a drain electrode D2 of the switching thin film transistor T2 is electrically connected to the driving voltage line 65 via the operation control thin film transistor T5, and is also electrically connected to the source electrode S1 of the driving thin film transistor T1. The switching thin film transistor T2 is turned on according to the scanning signal Sn transmitted through the scanning signal line 61 to perform the switching operation, so as to transmit the data signal Dm transmitted to the data line 64 to the source electrode S1 of the driving thin film transistor T1.

A gate electrode G3 of the compensating thin film transistor T3 is electrically connected to the scanning signal line 61, a source electrode S3 of the compensating thin film transistor T3 is electrically connected to the anode of the OLED via the light-emitting control thin film transistor T6, and is also electrically connected to the drain electrode D1 of the driving thin film transistor T1. Further, a drain electrode D3 of the compensating thin film transistor T3, one end (i.e., the first capacitor electrode) Cst1 of the storage capacitor Cst, a drain electrode D4 of the initialization thin film transistor T4, and the gate electrode G1 of the driving thin film transistor T1 are electrically connected together. The compensation thin film transistor T3 is turned on according to the scanning signal Sn transmitted through the scanning signal line 61 to connect the gate electrode G1 and the drain electrode D1 of the driving thin film transistor T1, thereby performing a diode connection for the driving thin film transistor T1.

A gate electrode G4 of the initialization thin film transistor T4 is electrically connected to the previous scanning signal line 62, and a source electrode S4 of the initialization thin film transistor T4 is electrically connected to the initialization voltage line 66. Further, the drain electrode D4 of the initializing thin film transistor T4, one end Cst1 of the storage capacitor Cst, the drain electrode D3 of the compensating thin film transistor T3, and the gate electrode G1 of the driving thin film transistor T1 are electrically connected together. The initialization thin film transistor T4 is turned on according to the previous scanning signal Sn-1 transmitted through the previous scanning signal line 62 to transmit the initialization voltage Vint to the gate electrode G1 of the driving thin film transistor T1, thereby performing an initialization operation to initialize a voltage at the gate electrode G1 of the driving thin film transistor T1.

A gate electrode G5 of the operation control thin film transistor T5 is electrically connected to the light-emitting control line 63, and a source electrode S5 of the operation control thin film transistor T5 is electrically connected to the driving voltage line 65. Further, a drain electrode D5 of the operation control thin film transistor T5, the source electrode S1 of the driving thin film transistor T1, and the drain electrode D2 of the switching thin film transistor T2 are electrically connected together.

A gate electrode G6 of the light-emitting control thin film transistor T6 is electrically connected to the light-emitting control line 63, a source electrode S6 of the light-emitting control thin film transistor T6 is electrically connected to the drain electrode D1 of the driving thin film transistor T1 and is electrically connected to the source electrode S3 of the compensation thin film transistor T3. Further, a drain electrode D6 of the light-emitting control thin film transistor T6 is electrically connected to the anode of the OLED. The operation control thin film transistor T5 and the light-emitting control thin film transistor T6 are turned on concurrently (e.g., simultaneously) according to the light-emitting control signal En transmitted through the light-emitting control line 63 to transmit the driving voltage ELVDD to the OLED, thereby allowing the driving current Id to flow into the OLED.

The bypass thin film transistor T7 includes: a gate electrode G7 connected to the previous scanning signal line 62; a source electrode S7 connected to both the drain electrode D6 of the light emitting control thin film transistor T6 and the anode of the OLED; and a drain electrode D7 connected to the initialization voltage line 66. The bypass thin film transistor T7 transmits the previous scanning signal Sn-1 from the previous scanning signal line 62 to the gate electrode G7.

The other end (hereinafter referred to as a second capacitance electrode) Cst2 of the storage capacitor Cst is electrically connected to the driving voltage line 65, and a cathode of the OLED is electrically connected to the power supply line 67 to receive the common voltage ELVSS. Correspondingly, the OLED receives the driving current Id from the driving thin film transistor T1 to emit light, thereby displaying an image.

It should be noted that in FIG. 6, each of the thin film transistors T1, T2, T3, T4, T5, T6, and T7 has a single gate structure. However, the embodiments of the present disclosure are not limited to this, at least some of the thin film transistors T1, T2, T3, T4, T5, T6, and T7 may have a double gate structure. In FIG. 6, each of the thin film transistors T1, T2, T3, T4, T5, T6, and T7 is a p-channel field effect transistor. However, the embodiments of the present disclosure are not limited to this, and at least some of the thin film transistors T1, T2, T3, T4, T5, T6, and T7 may be n-channel field effect transistors.

In operation, during an initialization phase, the previous scanning signal Sn-1 with a low level is supplied through the previous scanning signal line 62. Subsequently, the initialization thin film transistor T4 is turned on based on the low level of the previous scanning signal Sn-1, and the initialization voltage Vint from the initialization voltage line 66 is transmitted to the gate electrode G1 of the driving thin film transistor T1 through the initialization thin film transistor T4. Therefore, the driving thin film transistor T1 is initialized due to the initialization voltage Vint.

During a data programming phase, the scanning signal Sn with a low level is supplied through the scanning signal line 61. Subsequently, the switching thin film transistor T2 and the compensation thin film transistor T3 are turned on based on the low level of the scanning signal Sn. Therefore, the driving thin film transistor T1 is placed in a diode connection state and biased in the forward direction as the compensation thin film transistor T3 is turned on.

Subsequently, a compensation voltage Dm+Vth (for example, Vth is a negative value), that is obtained by subtracting the threshold voltage Vth of the driving thin film transistor T1 from the data signal Dm supplied via the data line 64, is applied to the gate electrode G1 of the driving thin film transistor T1. Subsequently, the driving voltage ELVDD and the compensation voltage Dm+Vth are applied to two ends of the storage capacitor Cst, respectively, so that an electric charge corresponding to voltage difference between the corresponding ends is stored in the storage capacitor Cst.

During the light-emitting phase, the light-emitting control signal En from the light-emitting control line 63 changes from a high level to a low level. Subsequently, during the light-emitting phase, the operation control thin film transistor T5 and the light-emitting control thin film transistor T6 are turned on based on the low level of the light-emitting control signal En.

Subsequently, the driving current is generated based on a difference between the voltage of the gate electrode G1 of the driving thin film transistor T1 and the driving voltage ELVDD. The driving current Id corresponding to the difference between the driving current and the bypass current is supplied to the OLED through the light-emitting control thin film transistor T6.

During the light-emitting phase, based on a current-voltage relationship of the driving thin film transistor T1, a gate-source voltage of the driving thin film transistor T1 is maintained at (Dm+Vth)-ELVDD due to the storage capacitor Cst. The drive current Id is proportional to (Dm-ELVDD)$^2$. Therefore, the driving current Id may not be affected by a variation of the threshold voltage Vth of the driving thin film transistor T1.

Figure 7:
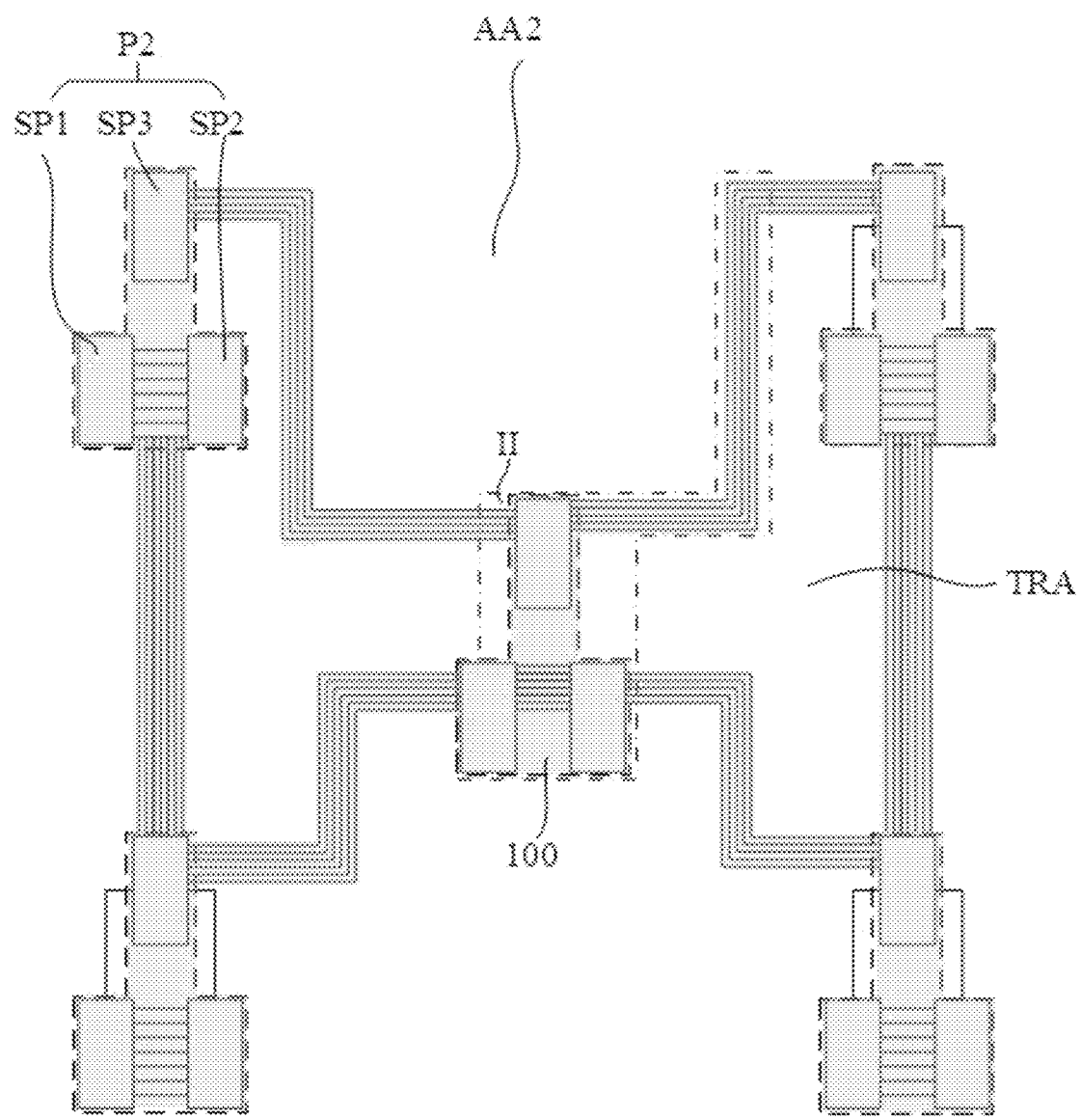
FIG. 7 is a schematic view of the second display region of the display panel according to some exemplary embodiments of the present disclosure, wherein a plurality of (for example, five) pixel units are shown schematically.
Figure 8:
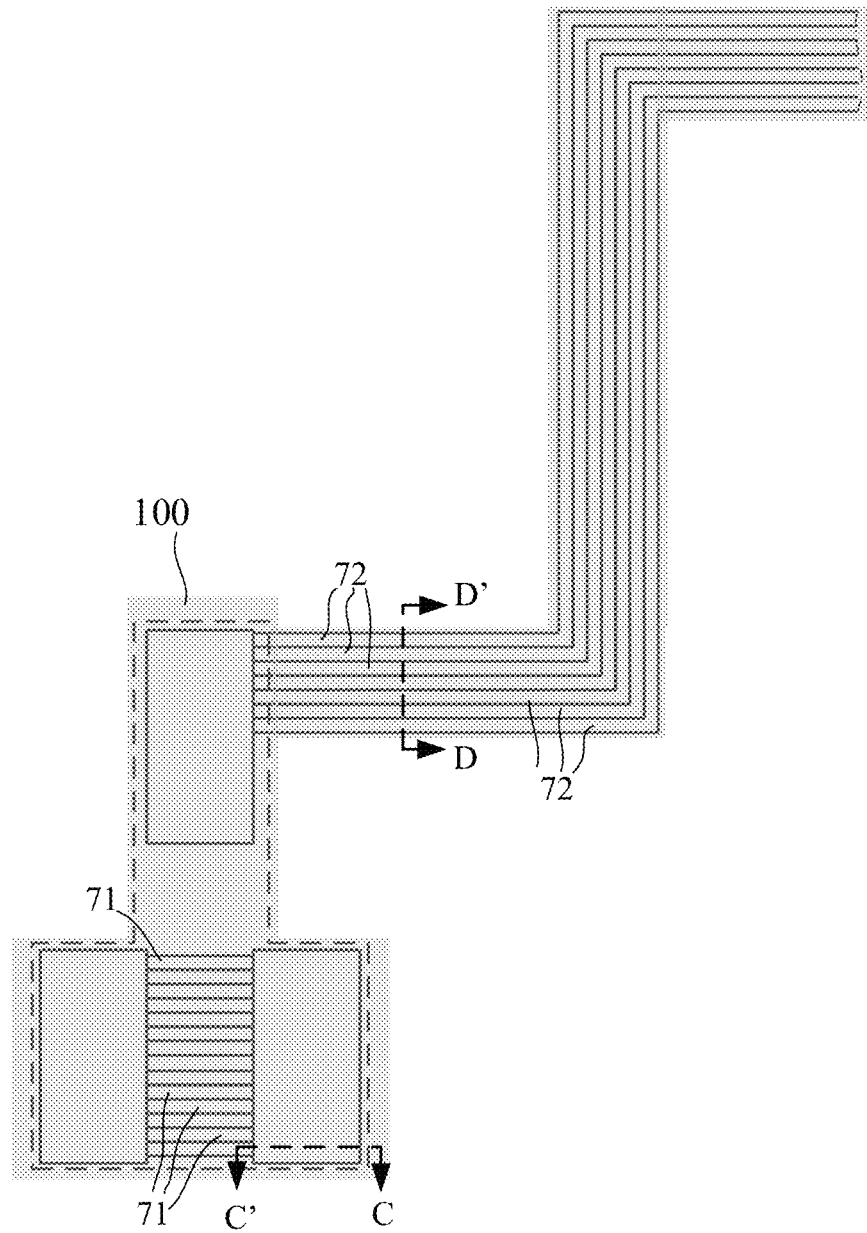
FIG. 8 is a partial enlarged view of section II in FIG. 7.

FIG. 7 is a schematic view of the second display region AA2 of the display panel according to some exemplary embodiments of the present disclosure, wherein several (for example, five) pixel units are shown schematically. FIG. 8 is a schematic partial enlarged view of section II in FIG. 7.

In the embodiments of the present disclosure, the display panel includes a plurality of signal lines on the base substrate 1, for example, the aforementioned signal lines 61, 62, 63, 64, 65, 66, and 67.

As shown in FIG. 7, the second display region AA2 includes a plurality of second pixel units P2 arranged in an array. For example, each second pixel unit P2 may further include a plurality of sub-pixel units, such as a red sub-pixel unit SP1, a green sub-pixel unit SP2, and a blue sub-pixel unit SP3. There is a light transmittance region TRA between the pixel units P2 in the second display region AA2, for allowing the light for imaging to pass through, so that light is incident onto the image sensor 2 provided in the second display region AA2.

In the text, the light for imaging may include at least one of visible light or infrared light, but the embodiments of the present disclosure do not limit this.

With reference to FIG. 7 and FIG. 8, various signal lines 61, 62, 63, 64, 65, 66, and 67 as described above extend inside each of the various pixel units and between any two ones of the various pixel units. In the second display region AA2, some relatively small gaps are formed between any two ones of the various signal lines. These gaps may be formed inside each of the various pixel units, as indicated by gaps 71 (hereinafter referred to as first gaps) as shown in FIG. 8; and may also be formed between any two ones of the various pixel units, as indicated by gaps 72 (hereinafter referred to as second gaps) as shown in FIG. 8. As an example, the gaps 71 are formed between any two ones of the plurality of signal lines inside the pixel unit, and the gaps 72 are formed between any two ones of the plurality of signal lines extending between any two pixel units.

In some exemplary embodiments of the present disclosure, the display panel further includes a light shielding portion 100 provided on the base substrate 1.

The light shielding portion 100 is made of a material that may shield the light for imaging. For example, the transmittance of the material to the light for imaging (such as infrared light or visible light) is less than 10%, for example, less than 5%, or, for example, less than 1%.

With reference to FIG. 7 and FIG. 8, an orthographic projection of the light shielding portion 100 on the base substrate 1 at least covers an orthographic projection of each of the gaps 71 and the gaps 72 on the base substrate 1.

By providing the light shielding portion, the diffraction and interference of the light for imaging may be avoided, so that a brightness change in a local region in the field of view may be reduced, and a visibility of the object may be improved. In this way, a glare phenomenon of the under-screen camera may be effectively eliminated, and the image quality may be improved.

FIG. 7 and FIG. 8 schematically show a distribution of sub-pixels in the second display region AA2 of the display panel according to some exemplary embodiments of the present disclosure, hereinafter, an exemplary implementation of the distribution of sub-pixels and signal lines in the second display region AA2 of the display panel according to some exemplary embodiments of the present disclosure will be described in more details with reference to the drawings.

Figure 9:
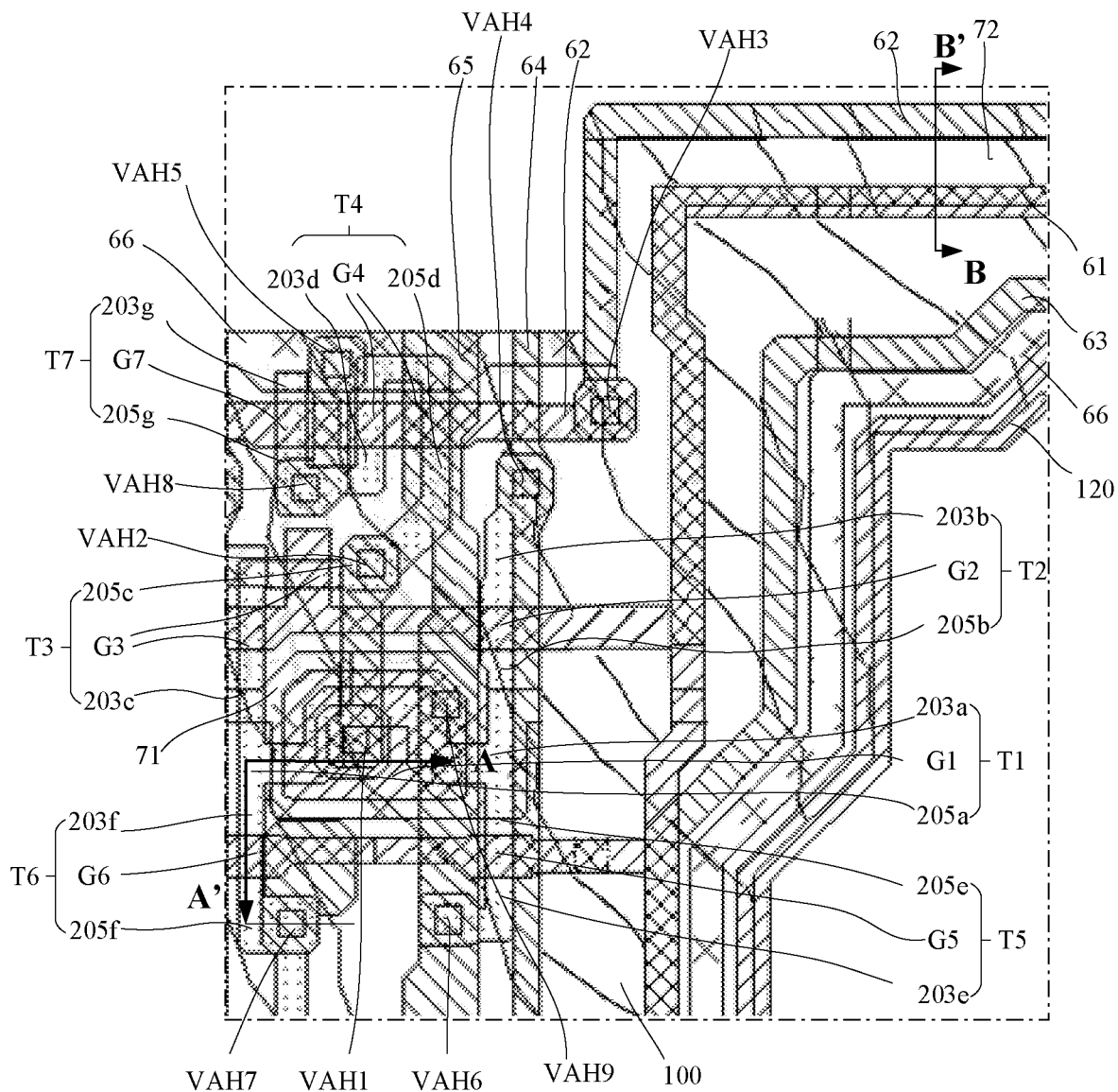
FIG. 9 is a plan view of an exemplary implementation of a sub-pixel in the second display region AA2 of the display panel according to some exemplary embodiments of the present disclosure.
Figure 14:
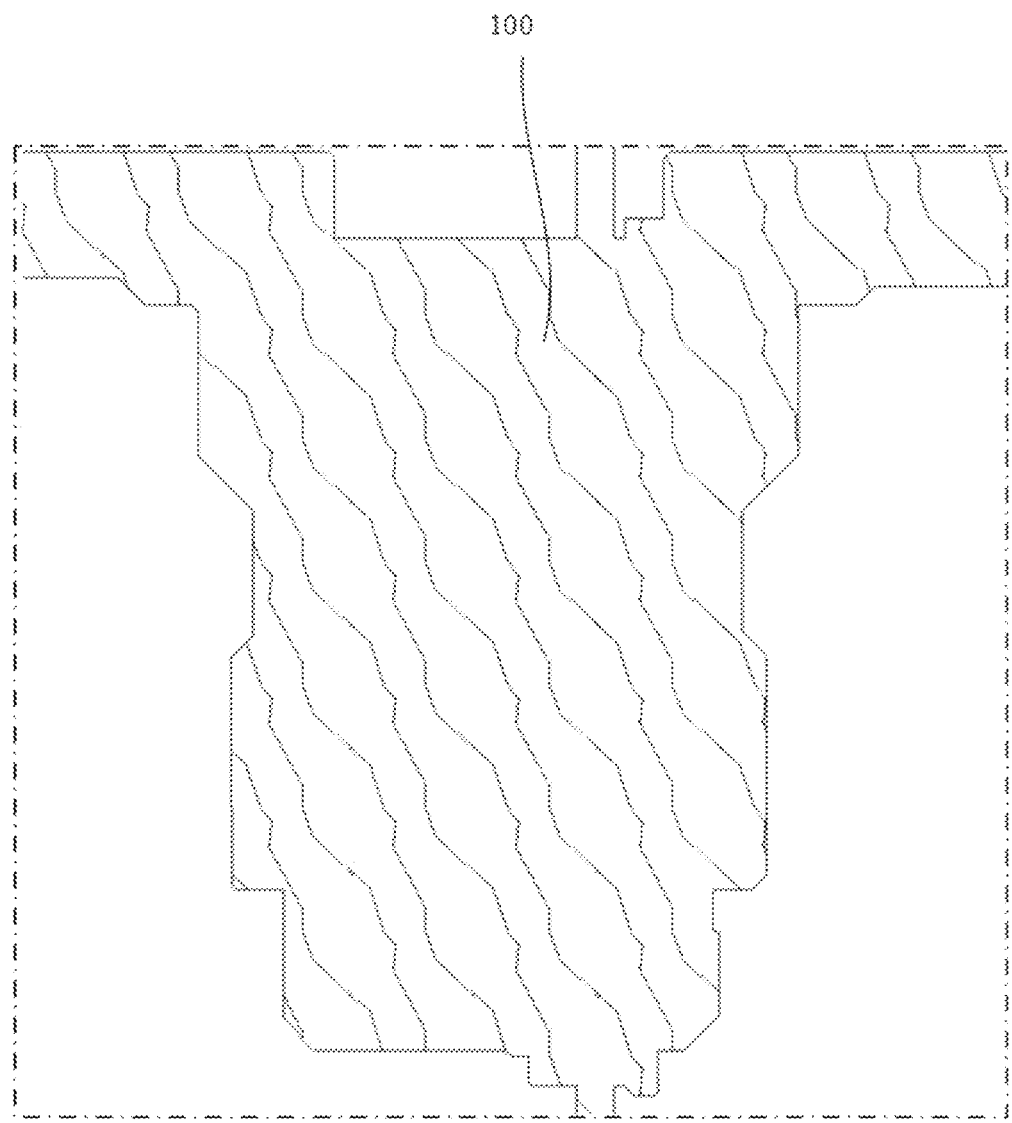

FIG. 9 is a plan view illustrating exemplary implementations of sub-pixels in the second display region AA2 of the display panel according to some exemplary embodiments of the present disclosure. FIG. 10 to FIG. 14 are plan views showing some film layers in the exemplary implementations of sub-pixels in FIG. 9. It should be noted that, in order to clearly show positional relationships between various film layers or traces, FIG. 9 to FIG. 14 do not show all film layer structures in the sub-pixels, that is, some structures are omitted. It should also be noted that, FIG. 9 to FIG. 13 show partial plan views of one sub-pixel included in the pixel units in FIG. 7 and FIG. 8, and FIG. 14 shows a plan view of a light shielding portion corresponding to one pixel unit in FIG. 7 and FIG. 8.

Specifically, FIG. 10 to FIG. 14 show schematic plan views of an active layer, a first conductive layer, a second conductive layer, a third conductive layer and a light shielding portion in one sub-pixel, respectively. The first conductive layer, the second conductive layer, and the third conductive layer will be described in further detail below. It should be understood that an insulating layer may be provided between any two adjacent ones of the active layer, the conductive layers and the light shielding portion, and a via hole may be provided in the insulating layer to electrically connect structures located in different layers.

With reference to FIG. 6 and FIG. 9 to FIG. 14 in combination, the sub-pixels include a scanning signal line 61, a previous scanning signal line 62, a light-emitting control line 63 and an initialization voltage line 66 arranged in a row direction. The scanning signal line 61, the previous scanning signal line 62, the light-emitting control line 63 and the initialization voltage line 66 are configured to apply a scanning signal Sn, a previous scanning signal Sn-1, a light-emitting control signal En, and an initialization voltage Vint to the sub-pixels, respectively. The sub-pixels may include a data line 64 and a driving voltage line 65 that cross the scanning signal line 61, the previous scanning signal line 62, the light-emitting control line 63, and the initialization voltage line 66. The data line 64 and the driving voltage line 65 are configured to apply a data signal Dm and a driving voltage ELVDD to the sub-pixels, respectively. The sub-pixels may include: a driving thin film transistor T1, a switching thin film transistor T2, a compensation thin film transistor T3, an initialization thin film transistor T4, an operation control thin film transistor T5, a light-emitting control thin film transistor T6, a bypass thin film transistor T7, a storage capacitor Cst, and an organic light-emitting diode OLED.

Figure 10:
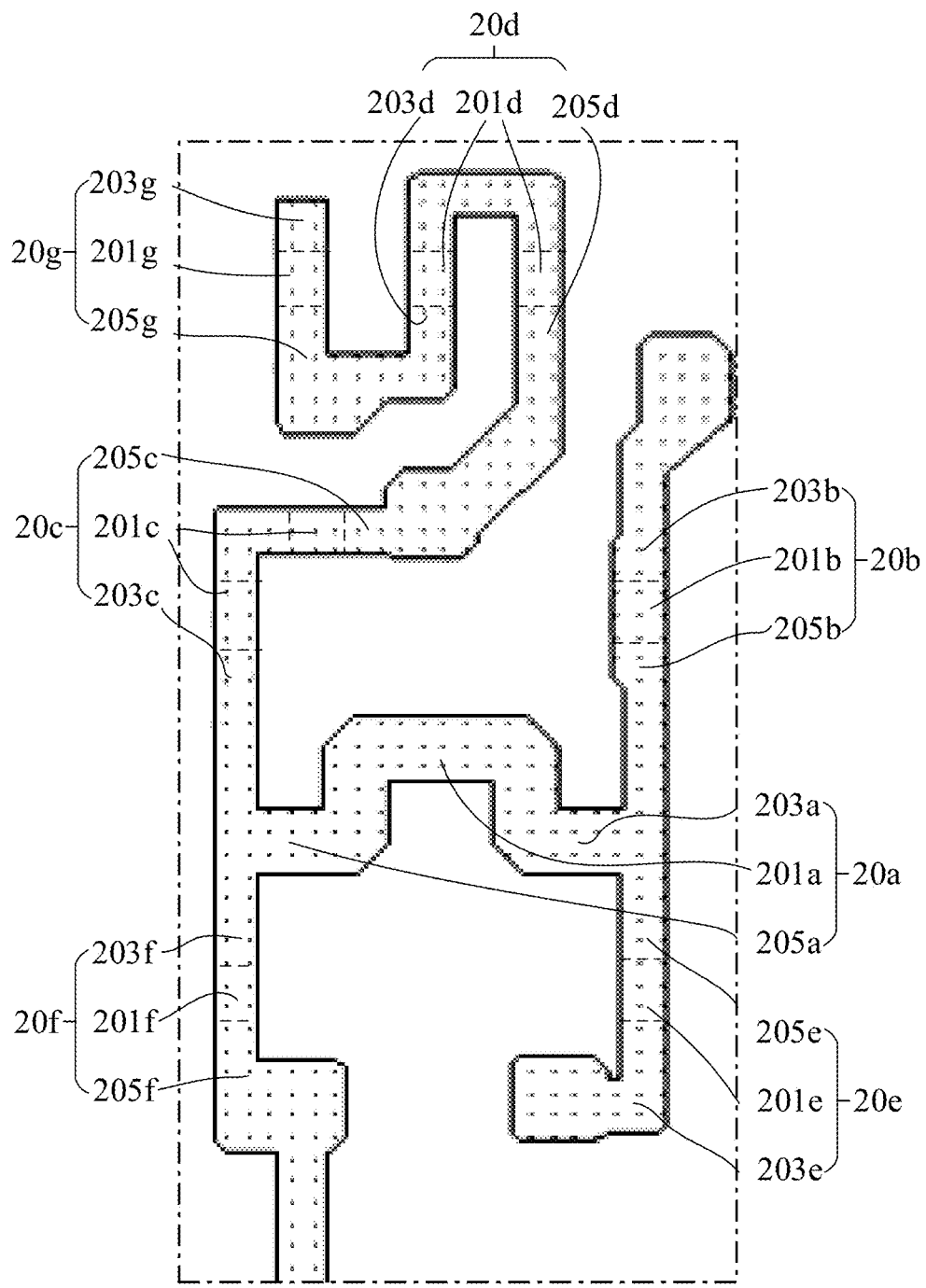
FIG. 10 to FIG. 14 are plan views illustrating some layers in the exemplary implementation of the sub-pixel in FIG. 9.
Figure 11:
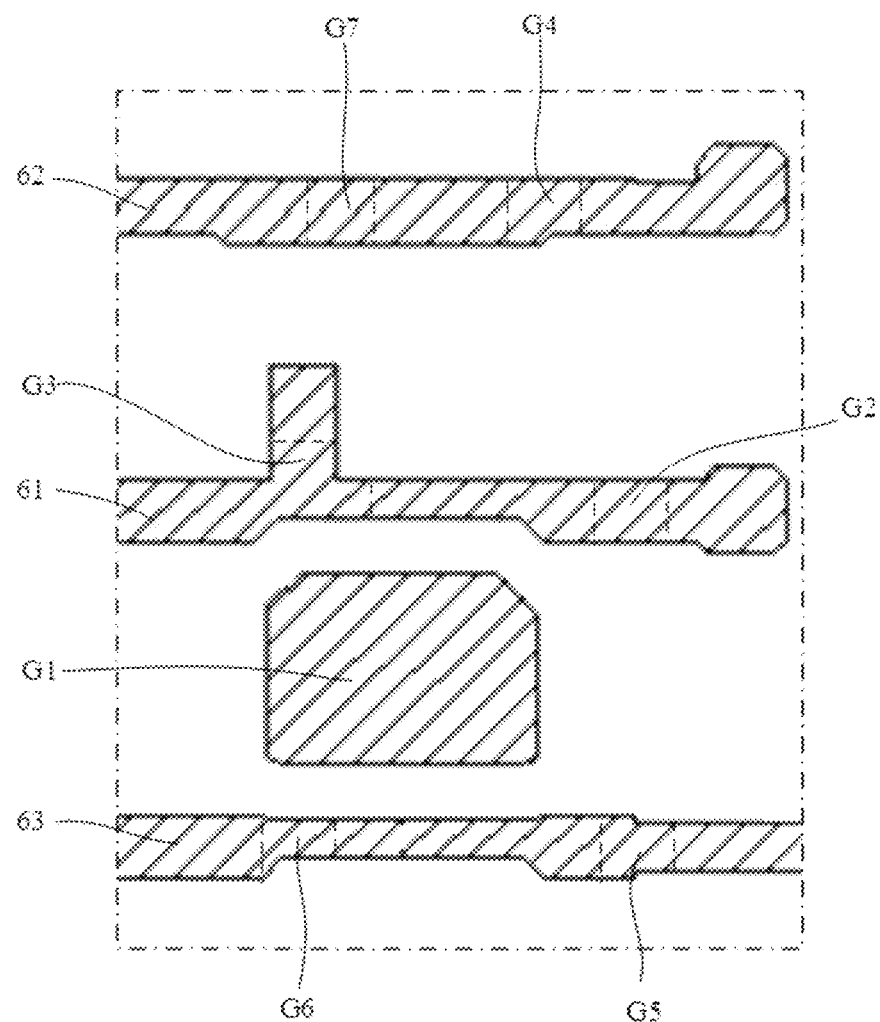
Figure 12:
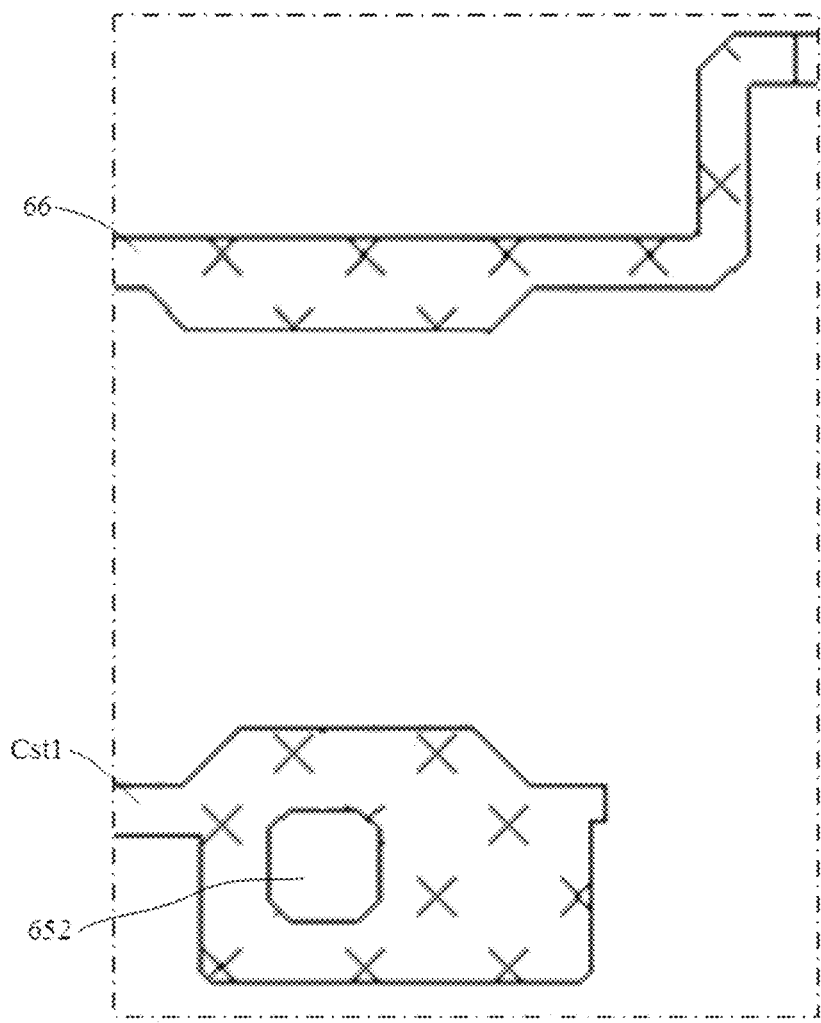
Figure 13:
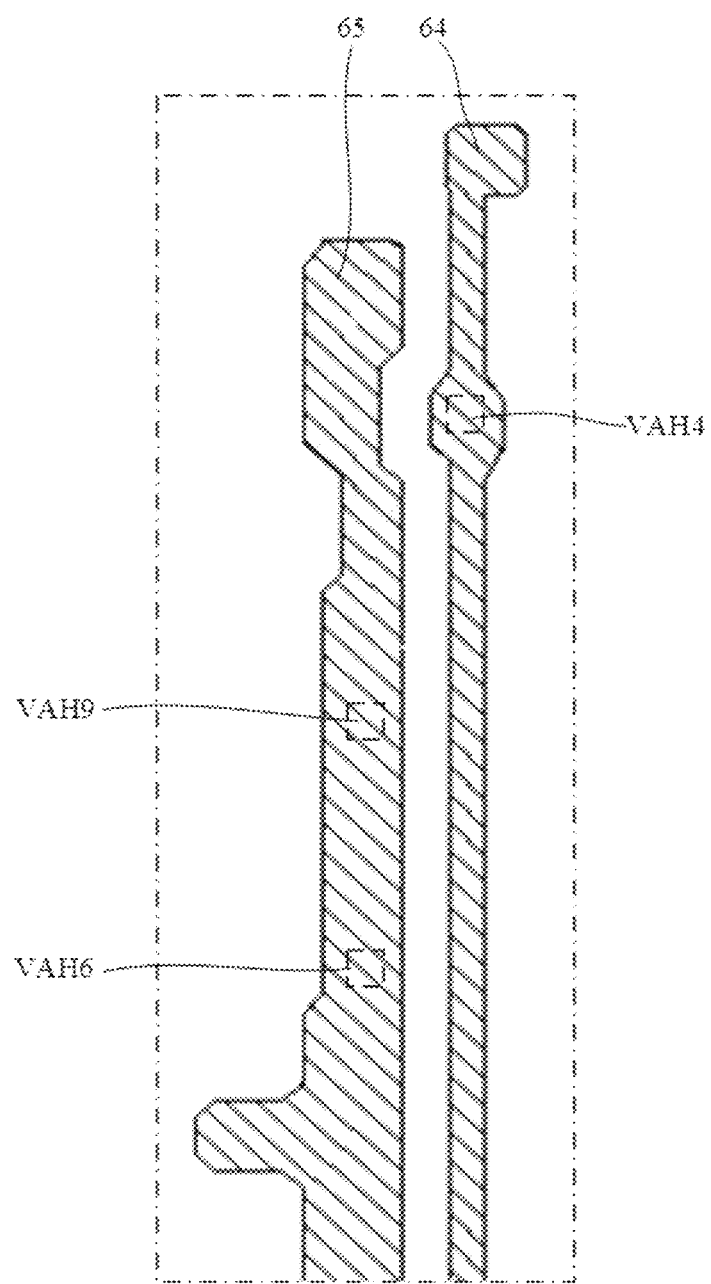

The driving thin film transistor T1, the switching thin film transistor T2, the compensation thin film transistor T3, the initialization thin film transistor T4, the operation control thin film transistor T5, the light-emitting control thin film transistor T6, and the bypass thin film transistor T7 may be formed along the active layer as shown in FIG. 10. The active layer may have a curved shape or polyline shape, and may include a driving active layer 20a corresponding to the driving thin film transistor T1, a switching active layer 20b corresponding to the switching thin film transistor T2, a compensation active layer 20c corresponding to the compensation thin film transistor T3, an initialization active layer 20d corresponding to the initialization thin film transistor T4, an operation control active layer 20e corresponding to the operation control thin film transistor T5, a light-emitting control active layer 20f corresponding to the light-emitting control thin film transistor T6, and a bypass active layer 20g corresponding to the bypasses thin film transistor T7.

The active layer may include, for example, polysilicon, and includes, for example, a channel region, a source region, and a drain region. The channel region may not be doped with impurities, and therefore have semiconductor characteristics. The source region and the drain region are respectively located on both sides of the channel region, and are doped with impurities, and therefore have conductivity. Impurities may vary depending on whether the TFT is an N-type or a P-type transistor.

The driving thin film transistor T1 includes a driving active layer 20a and a driving gate electrode G1. The driving active layer 20a includes a driving source region 203a, a driving drain region 205a, and a driving channel region 201a connecting the driving source region 203a and the driving drain region 205a. The driving source region 203a and the driving drain region 205a extend in two directions with respect to the driving channel region 201a. The driving source region 203a of the driving thin film transistor T1 is connected to a switching drain region 205b and an operation control drain region 205e. The driving drain region 205a is connected to a compensation source region 203c and a light-emitting control source region 203f. The gate electrode G1 of the driving thin film transistor T1 is connected to a compensation gate electrode G3 of the compensation thin film transistor T3 through via holes VAH1 and VAH2.

The switching thin film transistor T2 includes a switching active layer 20b and a switching gate electrode G2. The switching active layer 20b includes a switching channel region 201b, a switching source region 203b, and a switching drain region 205b. The switching thin film transistor T2 is used as a switching device for selecting a target sub-pixel to emit light. The switching gate electrode G2 is connected to the scanning signal line 61, the switching source region 203b is connected to the data line 64 through a via hole VAH4, and the switching drain region 205b is connected to the driving thin film transistor T1 and the operation control thin film transistor T5.

The compensation thin film transistor T3 includes a compensation active layer 20c and a compensation gate electrode G3. The compensation active layer 20c includes a compensation channel region 201c, a compensation source region 203c, and a compensation drain region 205c.

The initialization thin film transistor T4 includes an initialization active layer 20d and an initialization gate electrode G4. The initialized active layer 20d includes an initialization channel region 201d, an initialization source region 203d, and an initialization drain region 205d. The initialization source region 203d is connected to the initialization voltage line 66 through a via hole VAH5.

The operation control thin film transistor T5 includes an operation control active layer 20e and an operation control gate electrode G5. The operation control active layer 20e includes an operation control channel region 201e, an operation control source region 203e, and an operation control drain region 205e. The operation control source region 203e may be connected to the driving voltage line 65 through a via hole VAH6.

The light-emitting control thin film transistor T6 includes a light-emitting control active layer 20f and a light-emitting control gate electrode G6, and the light-emitting control active layer 20f includes a light-emitting control channel region 201f, a light-emitting control source region 203f, and a light-emitting control drain region 205f. The light-emitting control drain region 205f may be connected to an anode of the OLED through a via hole VAH7.

The bypass thin film transistor T7 includes a bypass active layer 20g and a bypass gate electrode G7. The bypass active layer 20g includes a bypass source region 203g, a bypass drain region 205g, and a bypass channel region 201g. The bypass drain region 205g is connected to the initialization source region 203d of the initialization thin film transistor T4. The bypass drain region 205g may be connected to the initialization voltage line 66 through a via hole VAH8.

The second storage capacitor plate Cst2 may be connected to the driving voltage line 65 through a via hole VAH9 located in the insulating layer.

As shown in FIG. 9, some signal lines are shown schematically, for example, including the scanning signal line 61, the previous scanning signal line 62, the light-emitting control line 63, and the initialization voltage line 66 arranged in the row direction to respectively apply the scanning signal Sn, the previous scanning signal Sn-1, the light-emitting control signal En, and the initialization voltage Vint to the sub-pixels, the data line 64 and the driving voltage line 65 crossing the scanning signal line 61, the previous scanning signal line 62, the light-emitting control line 63, and the initialization voltage line 66 to respectively apply the data signal Dm and the driving voltage ELVDD to the sub-pixels.

For example, a part of the previous scanning signal line 62 and another part of the previous scanning signal line 62 may be located in different layers and connected with each other through the via hole VAH3.

Figure 15:
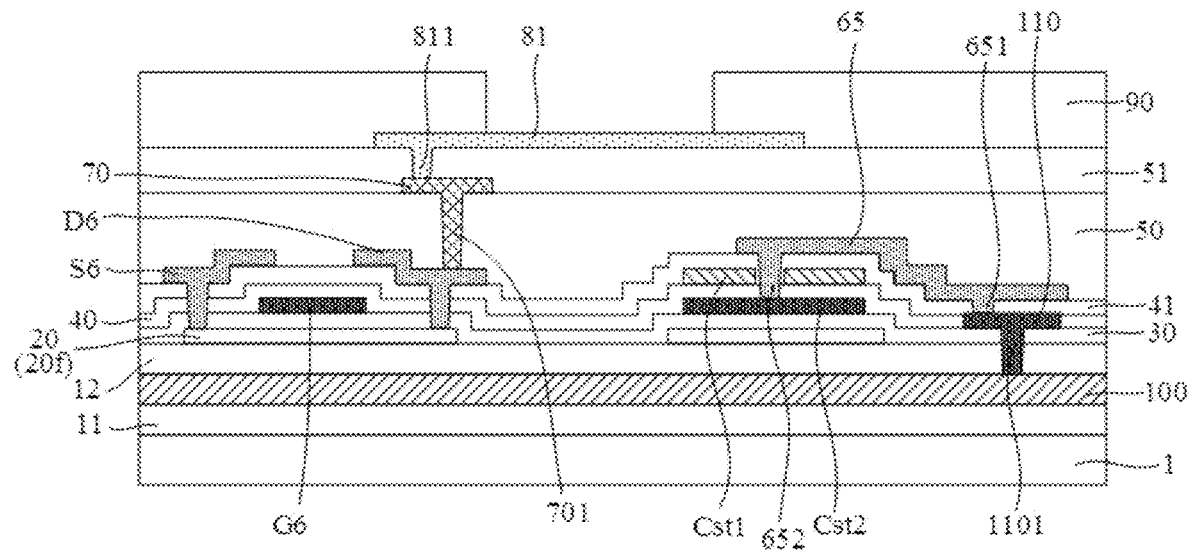
FIG. 15 is a schematic cross-sectional view of the display panel according to some exemplary embodiments of the present disclosure taken along line AA' in FIG. 9.
Figure 16:
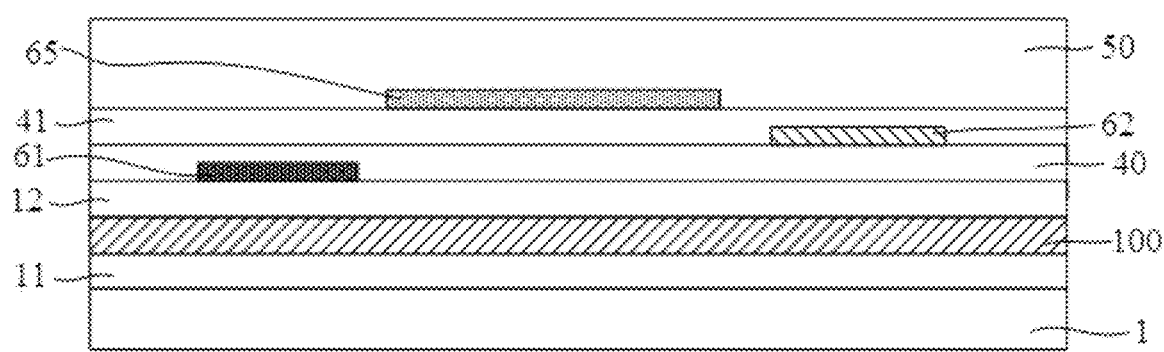
FIG. 16 is a schematic cross-sectional view of the display panel according to some exemplary embodiments of the present disclosure taken along line BB' in FIG. 9.

FIG. 15 is a schematic cross-sectional view of the display panel according to some exemplary embodiments of the present disclosure taken along line AA' in FIG. 9. FIG. 16 is a schematic cross-sectional view of the display panel according to some exemplary embodiments of the present disclosure taken along line BB' in FIG. 9. It should be noted that, in order to clearly show the relative positional relationship of the light shielding portion, some structures and layers are omitted in the cross-sectional views of FIG. 15 and FIG. 16. For example, only one thin film transistor, which may be the light-emitting control thin film transistor T6 shown in FIG. 6, is shown in FIG. 15.

With reference to FIG. 15, the insulating layer may include at least some of a gate insulating layer 30, a first interlayer insulating layer 40, a second interlayer insulating layer 41, a first planarization layer 50, and a second planarization layer 51.

With reference to FIG. 15 and FIG. 16 in combination, the display panel may include: an active layer 20 on the base substrate 1, a gate insulating layer 30 on a side of the active layer 20 away from the base substrate 1, a gate electrode G6 and a second capacitor electrode Cst2 on a side of the gate insulating layer 30 away from the base substrate 1, a first interlayer insulating layer 40 on a side of the gate electrode G6 and the second capacitor electrode Cst2 away from the base substrate 1, a first capacitor electrode Cst1 on a side of the first interlayer insulating layer 40 away from the base substrate 1, a second interlayer insulating layer 41 on a side of the first capacitor electrode Cst1 away from the base substrate 1, a source electrode S6 and a drain electrode D6 on a side of the second interlayer insulating layer 41 away from the base substrate 1, and a first planarization layer 50 covering the source electrode S6 and the drain electrode D6. The source electrode S6 and the drain electrode D6 are respectively connected to the active layer 20 through via holes.

It should be understood that the active layer 20 may be, for example, the film layer shown in FIG. 10, which may include the active layers 20a, 20b, 20c, 20d, 20e, 20f, and 20g of various thin film transistors.

The active layer 20, the gate electrode G6, the source electrode S6, and the drain electrode D6 form a light-emitting control thin film transistor T6, the first capacitor electrode Cst1 and the second capacitor electrode Cst2 are opposite to each other, and are spaced apart by the first interlayer insulating layer 40 to form the storage capacitor Cst.

The display panel may further include: a conductive connecting portion 70 on a side of the first planarization layer 50 away from the base substrate 1, a second planarization layer 51 on a side of the conductive connecting portion 70 away from the base substrate 1, an anode 81 of the OLED on a side of the second planarization layer 51 away from the base substrate 1, and a pixel defining layer 90 on a side of the anode 81 away from the base substrate 1. It should be understood that the OLED may also include an organic light-emitting layer and a cathode disposed on a side of the anode 81 away from the base substrate 1. The anode 81 is electrically connected to the conductive connecting portion 70 through a via hole 811, and the conductive connecting portion 70 is electrically connected to the drain electrode D6 through a via hole 701, that is, the anode 81 is electrically connected to the drain electrode D6 via the conductive connecting portion 70.

In the illustrated examples, the second capacitor electrode Cst2 and the gate electrode G6 are located in the same layer, for example, formed by the same patterning process. For the convenience of description, the layer where the second capacitor electrode Cst2 and the gate electrode G6 are located may be referred to as a first conductive layer. The first capacitor electrode Cst1 is located between the first conductive layer and a conductive layer where the source electrode S6 and the drain electrode D6 are located. For the convenience of description, the layer where the first capacitor electrode Cst1 is located may be referred to as a second conductive layer, and the layer where the source electrode S6 and the drain electrode D6 are located may be referred to as a third conductive layer. The conductive connecting portion 70 is located on a side of the third conductive layer away from the base substrate 1. For the convenience of description, the layer where the conductive connecting portion 70 is located may be referred to as a fourth conductive layer.

In the embodiments of the present disclosure, the aforementioned various signal lines 61, 62, 63, 64, 65, 66, and 67 may be located in at least one conductive layer selected from the first conductive layer, the second conductive layer, the third conductive layer, and the fourth conductive layer, respectively. For example, the scanning signal line 61 and the previous scanning signal line 62 may be located in the first conductive layer, the light-emitting control line 63 may be located in the second conductive layer, the data line 64 and the driving voltage line 65 may be located in the third conductive layer, and the initialization voltage line 66 may be located in the fourth conductive layer. However, the embodiments of the present disclosure are not limited to this. A signal line may also be located in a plurality of conductive layers. For example, some driving voltage lines 65 may be located in the third conductive layer, and some other driving voltage lines 65 may be located in the fourth conductive layer.

For example, the first conductive layer and the second conductive layer may be conductive layers made of a material forming the gate electrode, and the third conductive layer and the fourth conductive layer may be conductive layers made of a material forming the source electrode and the drain electrode.

For example, the material forming the gate electrode may include metal materials, such as Mo, Al, Cu, other metals and alloys thereof. The material forming the source electrode and the drain electrode may include metal materials, such as Mo, Al, Cu, other metals and alloys thereof. The semiconductor material forming the active layer may include, for example, amorphous silicon, polysilicon, an oxide semiconductor, etc., and the oxide semiconductor material may include, for example, IGZO (Indium Gallium Zinc Oxide), ZnO (Zinc Oxide), etc.

In some embodiments of the present disclosure, the light shielding portion 100 may be a film layer that is provided separately. With Reference to FIG. 15 and FIG. 16, the light shielding portion 100 is provided under the active layer 20, that is, on a side of the active layer 20 close to the base substrate 1. That is, the light shielding portion 100 is located in a layer different from all of the first conductive layer, the second conductive layer, the third conductive layer, and the fourth conductive layer, that is, it is a separate film layer.

For example, the light shielding portion 100 may be made of a metal light shielding material, and the metal light shielding material may be the same material as the material forming the gate electrode or the material forming the source electrode and the drain electrode, or may be a material different from the material forming the gate electrode or the material forming the source electrode and the drain electrode.

It should be noted that in the plan views of FIG. 7 and FIG. 8, the light shielding portion 100 is shown as a gray pattern, and in FIG. 9 to FIG. 16 and subsequent drawings, the light shielding portion 100 is shown as a pattern with an oblique hatching, which is only to make the drawings clear.

Optionally, the display panel may include a first buffer layer 11 and a second buffer layer 12 on the base substrate 1. The first buffer layer 11 may be located between the base substrate 1 and the light shielding portion 100. The second buffer layer 12 may be located between the light shielding portion 100 and the active layer 20.

With reference to FIG. 7 to FIG. 16, an orthographic projection of the light shielding portion 100 on the base substrate 1 at least covers orthographic projections of the gaps between any two ones of the plurality of signal lines (including the gaps 71 and the gaps 72) on the base substrate 1.

For example, with reference to FIG. 9, orthographic projections of the driving thin film transistor T1, the switching thin film transistor T2, the compensation thin film transistor T3, the initialization thin film transistor T4, the operation control thin film transistor T5, the light-emitting control thin film transistor T6 and the bypass thin film transistor T7, together with the various signal lines 61, 62, 63, 64, 65, 66, and 67 on the base substrate 1 do not completely cover the base substrate 1, thereby forming some gaps. Gaps inside each pixel unit are marked as the first gaps 71, and gaps between any two ones of various pixel units are marked as the second gaps 72.

Specifically, the scanning signal line 61, the previous scanning signal line 62, the light-emitting control line 63, and the initialization voltage line 66 arranged in the row direction have a first portion located inside the sub-pixels, the data line 64 and the driving voltage line 65 crossing the scanning signal line 61, the previous scanning signal line 62, the light-emitting control line 63 and the initialization voltage line 66 also have a first portion located inside the sub-pixels. The first gaps 71 are also formed between any two ones of the first portions of the scanning signal line 61, the previous scanning signal line 62, the light-emitting control line 63, the initialization voltage line 66, the data line 64 and the driving voltage line 65. The scanning signal line 61, the previous scanning signal line 62, the light-emitting control line 63, and the initialization voltage line 66 also extend in the row direction to adjacent pixel units, that is, the scanning signal line 61, the previous scanning signal line 62, the light-emitting control line 63, and the initialization voltage line 66 have a second portion located between any two ones of the pixel units. In addition, a pixel density in the first display region AA1 is greater than a pixel density in the second display region AA2, the scanning signal lines in the first display region AA1 need to pass through the second display region AA2 in the row direction, as indicated by a signal line extension portion 120 in FIG. 9. That is, the signal line extension portion 120 in FIG. 9 is a portion of the scanning signal line in the first display region AA1 extending to the second display region AA2. The second gaps 72 are also formed between any two ones of the second portions of the scanning signal line 61, the previous scanning signal line 62, the light-emitting control line 63 and the initialization voltage line 66 as well as the signal line extension portion 120.

The orthographic projection of the light shielding portion 100 on the base substrate 1 at least covers the orthographic projection of each of the first gaps 71 and the second gaps 72 on the base substrate 1.

Optionally, with reference to FIG. 9 and FIG. 14, the orthographic projection of the light shielding portion 100 on the base substrate 1 covers orthographic projections of portions of the plurality of signal lines in the second display region AA2 on the base substrate 1, and the orthographic projection of the light shielding portion 100 on the base substrate 1 also covers orthographic projections of the plurality of thin film transistors T1~T7 and the storage capacitor Cst in the second display region AA2 on the base substrate 1.

By providing the above-mentioned light shielding portion separately, it is possible to ensure shielding the gaps inside each pixel unit and the gaps between any two ones of the signal lines between any two ones of the pixel units, thereby reliably avoiding the diffraction and the interference of the light for imaging.

It should be understood that the orthographic projection of the light shielding portion 100 on the base substrate 1 does not overlap most of an orthographic projection of the light transmittance region TRA between any two pixel units P2 in the second display region AA2 on the base substrate 1. In this way, there is still a large area of the light transmittance region TRA between any two pixel units P2 in the second display region AA2, so that it is beneficial for the light for imaging to passing through the light transmittance region TRA so as to be incident onto the image sensor 2 provided in the second display region AA2.

Continuing to refer to FIG. 15, the light shielding portion 100 is electrically connected to the driving voltage line 65. With reference to FIG. 6 and FIG. 15 in combination, the driving voltage line 65 is used to supply the ELVDD voltage signal. That is to say, the light shielding portion 100 is also used to supply the ELVDD voltage signal.

Specifically, referring to FIG. 15, the driving voltage line 65 is electrically connected to a conductive transfer portion 110 through a via hole 651, and the conductive transfer portion 110 is electrically connected to the light shielding portion 100 through a via hole 1101. Since there is a relatively large distance between the driving voltage line 65 and the light shielding portion 100 in a direction perpendicular to the base substrate 1, the provision of the conductive transfer portion 110 facilitates the electrical connection between the light shielding portion 100 and the driving voltage line 65. For example, the conductive transfer portion 110 may be located in the aforementioned first conductive layer, that is, the conductive transfer portion 110 is located in the same layer as the gate electrode G6 and the second capacitor electrode Cst2. The via hole 651 penetrates the first interlayer insulating layer 40 and the second interlayer insulating layer 41 to expose a part of the conductive transfer portion 110. The via hole 1101 penetrates the gate insulating layer 30 and the second buffer layer 12 to expose a part of the light shielding portion 100.

With reference to FIG. 6 and FIG. 15 in combination, the driving voltage line 65 is also electrically connected to the second capacitor electrode Cst2, for example, the driving voltage line 65 is electrically connected to the second capacitor electrode Cst2 through a via hole 652. The via hole 652 may penetrate the first interlayer insulating layer 40, the first capacitor electrode Cst1, and the second interlayer insulating layer 41 to expose a part of the second capacitor electrode Cst2.

In this way, the light shielding portion 100 is electrically connected to a stable DC voltage signal, and the electric charge generated due to the floating of the light shielding portion 100 may be avoided, so that an ESD phenomenon may be prevented. In addition, both the light shielding portion 100 and the driving voltage line 65 are used as signal lines for supplying the ELVDD voltage signal, so that the IR Drop effect may be effectively reduced, thereby achieving an effect of compensating for brightness uniformity.

FIG. 17 to FIG. 20 are schematic plan views of the light shielding portion included in the display panel according to some exemplary embodiments of the present disclosure, respectively. With reference to FIG. 13 to FIG. 20, the light shielding portion 100 is a film layer which is provided separately, so that there is not a positional interference between the light shielding portion 100 and other film layers such as the first conductive layer, the second conductive layer, the third conductive layer and the fourth conductive layer. Thus, it is allowed to design a shape of an orthographic projection of the light shielding portion 100 on the base substrate 1.

For example, the orthographic projection of the light shielding portion 100 on the base substrate 1 may extend continuously, that is, a portion 101 of the light shielding portion 100 for shielding the gaps 71 inside each pixel unit serves as a first light shielding sub-portion, a portion 102 of the light shielding portion 100 for shielding the gaps 72 between any two pixel units serves as a second light shielding sub-portion, and the first light shielding sub-portion 101 and the second light shielding sub-portion 102 may be connected to each other. In this way, it is beneficial for forming the light shielding portion 100.

For example, the orthographic projection of the light shielding portion 100 on the base substrate 1 may cover orthographic projections of various pixel units in the second display region AA2 on the base substrate 1, and an area of the orthographic projection of the light shielding portion 100 on the base substrate 1 may be larger than an overall area of the orthographic projections of various pixel units in the second display region AA2 on the base substrate 1. Moreover, the orthographic projection of the light shielding portion 100 on the base substrate 1 may cover orthographic projections of portions of the signal lines between any two ones of the pixel units in the second display region AA2 on the base substrate 1, and the area of the orthographic projection of the light shielding portion 100 on the base substrate 1 may be larger than an overall area of the orthographic projections of portions of the signal lines between any two ones of the pixel units in the second display region AA2 on the base substrate 1. In this way, the light shielding portion 100 may cover the various pixel units and edges of the signal lines between any two ones of the pixel units sufficiently, so that a shielding effect of the light shielding portion for each gap may be improved.

The shape of the orthographic projection of the light shielding portion 100 on the base substrate 1 may be designed. For example, in the embodiments as shown in FIG. 17 to FIG. 20, a profile of the orthographic projection of the light shielding portion 100 on the base substrate 1 may have an arc shape at a corner or a boundary. In this way, the arc-shaped corner or boundary may reduce the diffraction effect when the light for imaging passes, thereby further improving the imaging quality.

Figure 17:
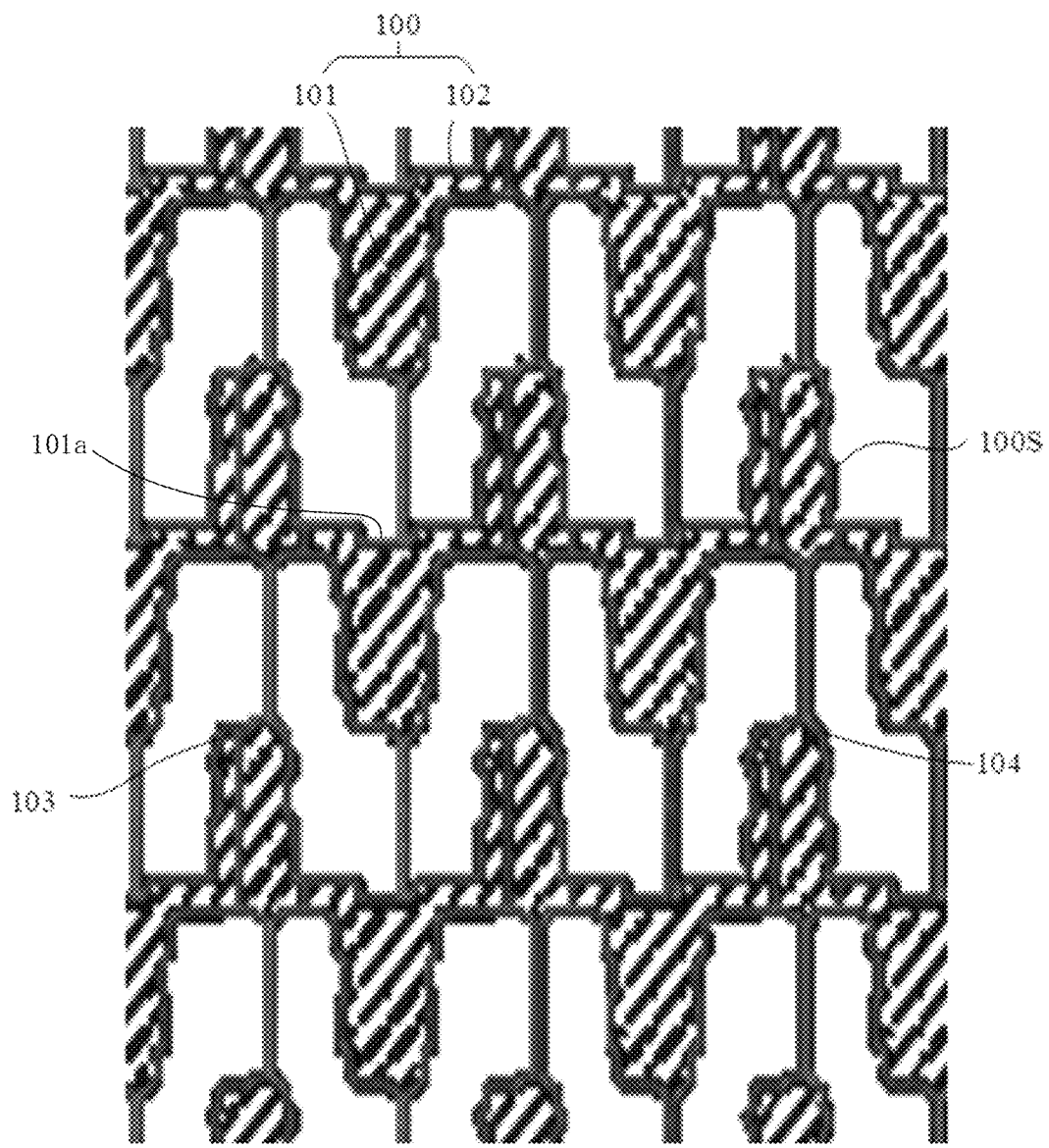
FIG. 17 to FIG. 20 are schematic plan views of the light shielding portion included in the display panel according to some exemplary embodiments of the present disclosure.

Specifically, with reference to FIG. 17, in the second display region AA2, the boundary 100S of the profile of the orthographic projection of the light-shielding portion 100 on the base substrate 1 may be closely adjacent to boundaries of the orthographic projections of various pixel units on the base substrate 1 and boundaries of the orthographic projections of the signal lines between any two ones of the pixel units on the base substrate 1. Here, an expression "closely adjacent to" may be understood as follows: in the second display region AA2, the orthographic projection of the light shielding portion 100 on the base substrate 1 may cover the orthographic projections of various pixel units on the base substrate 1 and the orthographic projections of the signal lines between any two ones of the pixel units on the base substrate 1, and the area of the orthographic projection of the light shielding portion 100 on the base substrate 1 may be slightly larger than an overall area of the orthographic projections of various pixel units and the orthographic projections of the signal lines between any two ones of the pixel units on the base substrate 1. In this way, an area of the light transmittance region may be made as large as possible while ensuring the light shielding effect, so that the image quality may be further improved.

With reference to FIG. 17, in the first light shielding sub-portion 101 in the an $(N+1)^{th}$ row of first light shielding sub-portions 101, the first light shielding sub-portion 101 has a first notch 101a, and the first notch 101a is located on a side edge of the first light shielding sub-portion 101 close to an $N^{th}$ row of first light shielding sub-portions 101 and is recessed in a direction away from the $N^{th}$ row of first light shielding sub-portions 101, where N is an odd number.

As shown in FIG. 17, the boundary 100S of the profile of the orthographic projection of the light shielding portion 100 on the base substrate 1 has an arc shape at each corner (for example, corners 103 and 104 exemplarily shown in FIG. 17), that is, an arc transition is formed at each corner. In this way, the arc-shaped corner or boundary may reduce the diffraction effect when the light for imaging passes, thereby further improving the imaging quality.

Figure 18:
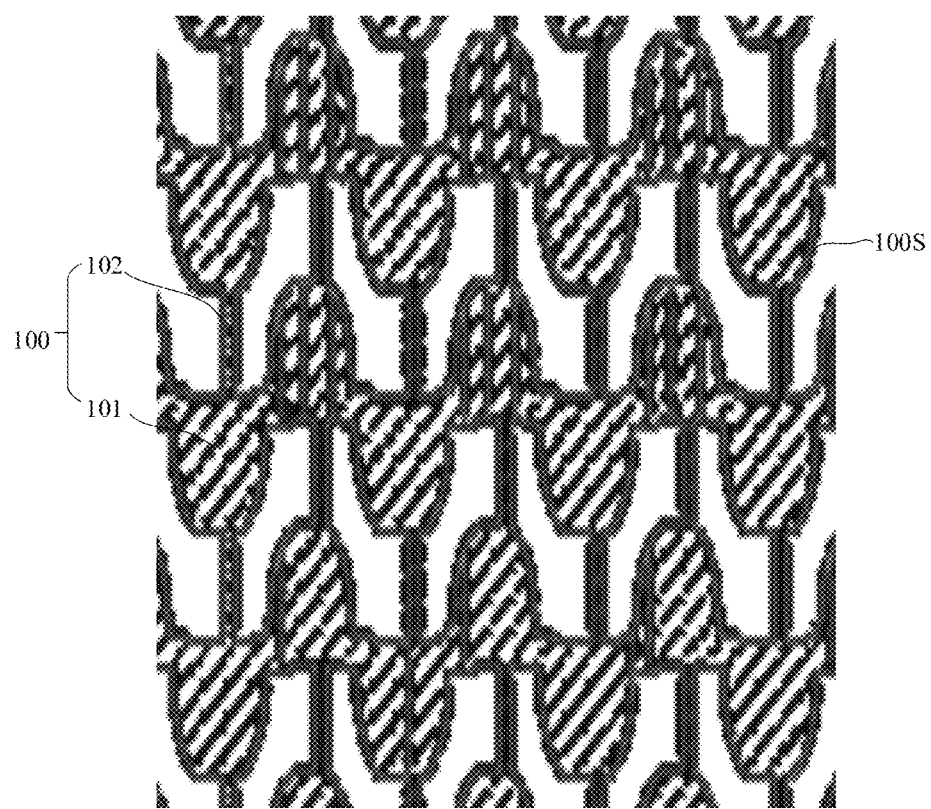

With reference to FIG. 18, the profile of the orthographic projection of the light shielding portion 100 on the base substrate 1 has an arc-shaped boundary 100S. In this way, the arc-shaped profile may reduce the diffraction effect when the light for imaging passes, thereby further improving the imaging quality.

Figure 19:
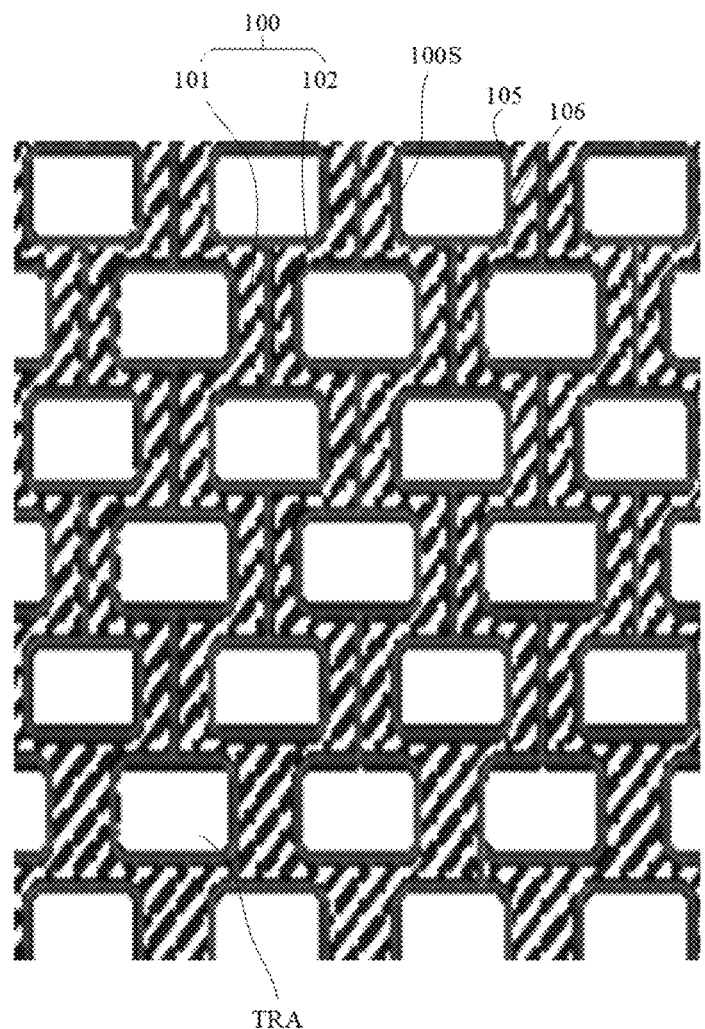

With reference to FIG. 19, the profile 100S of the orthographic projection of the light shielding portion 100 on the base substrate 1 has an arc shape at each corner (such as corners 105 and 106 exemplarily shown in FIG. 19), that is, an arc transition is formed. In this way, the arc-shaped corners may reduce the diffraction effect when the light for imaging passes, thereby further improving the imaging quality.

In the embodiment shown in FIG. 19, the orthographic projection of each light transmittance region TRA on the base substrate 1 has a rectangular shape with rounded corners. In this way, the formed pattern is relatively regular, so that it is beneficial to forming the light shielding portion, and it also facilitates improving the uniformity of the light for imaging incident onto the imaging module.

Figure 20:
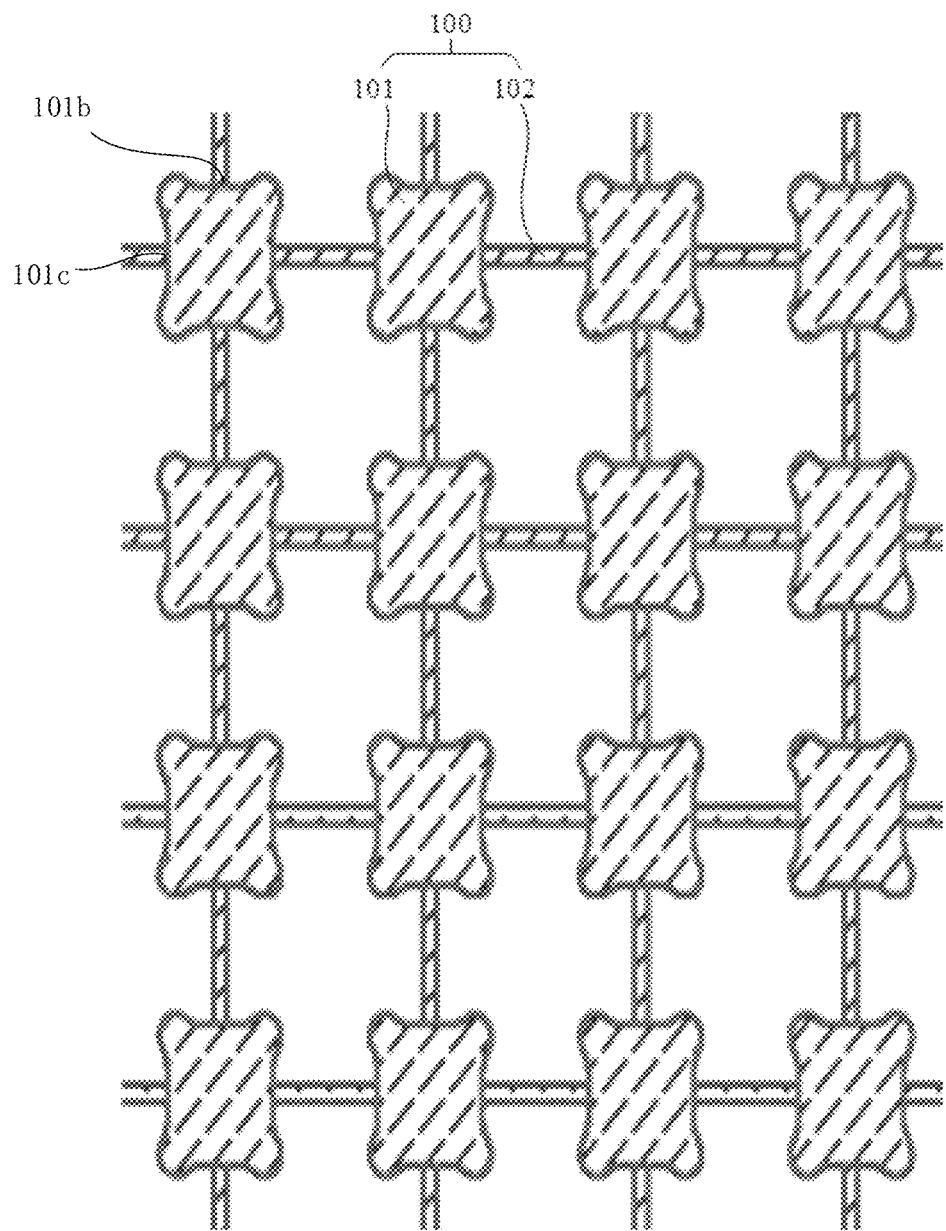

With reference to FIG. 20, a profile of an orthographic projection of a part 101 of the light shielding portion 100 for shielding the gaps inside each pixel unit on the base substrate 1 has an approximately rectangular shape, and four corners of the rectangle form arc transitions to reduce the diffraction effect when the light for imaging passes.

With reference to FIG. 20, the first light shielding sub-portion 101 has a second notches 101b on each of opposite side edges in the column direction, and the second notch 101b is recessed toward the center of the first light shielding sub-portion 101 in the column direction. The first light shielding sub-portion 101 has a third notch 101c on each of opposite side edges in the row direction, and the third notch 101c is recessed toward the center of the first light shielding sub-portion 101 in the row direction.

A profile of an orthographic projection of a part of the light shielding portion 100 for shielding the gaps between any two ones of the pixel units on the base substrate 1 is closely adjacent to the profile of the orthographic projections of the signal lines between any two ones of the sub-pixel units on the base substrate 1.

Alternatively or additionally, in some embodiments of the present disclosure, the light shielding portion 100 may be located in at least one layer selected from the above-mentioned first conductive layer, second conductive layer, third conductive layer, or fourth conductive layer.

Figure 21:
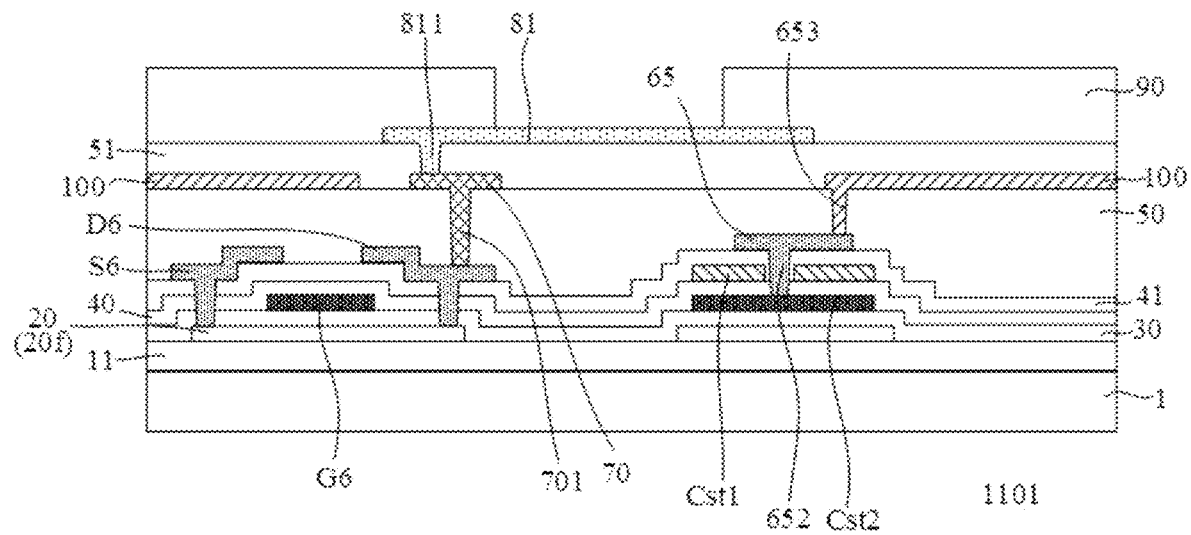
FIG. 21 is a schematic cross-sectional view of the display panel according to some exemplary embodiments of the present disclosure taken along line CC' in FIG. 8.
Figure 22:
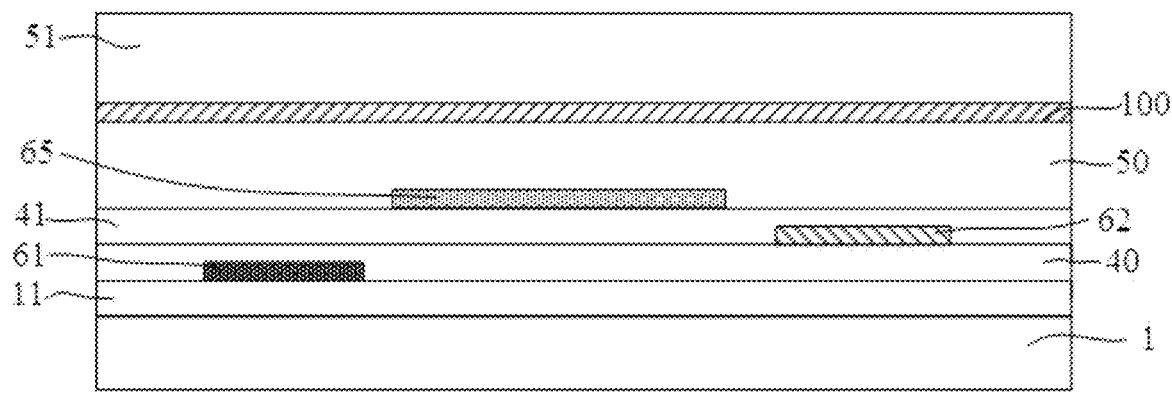
FIG. 22 is a schematic cross-section view of the display panel according to some exemplary embodiments of the present disclosure taken along line DD' in FIG. 8.
Figure 23:
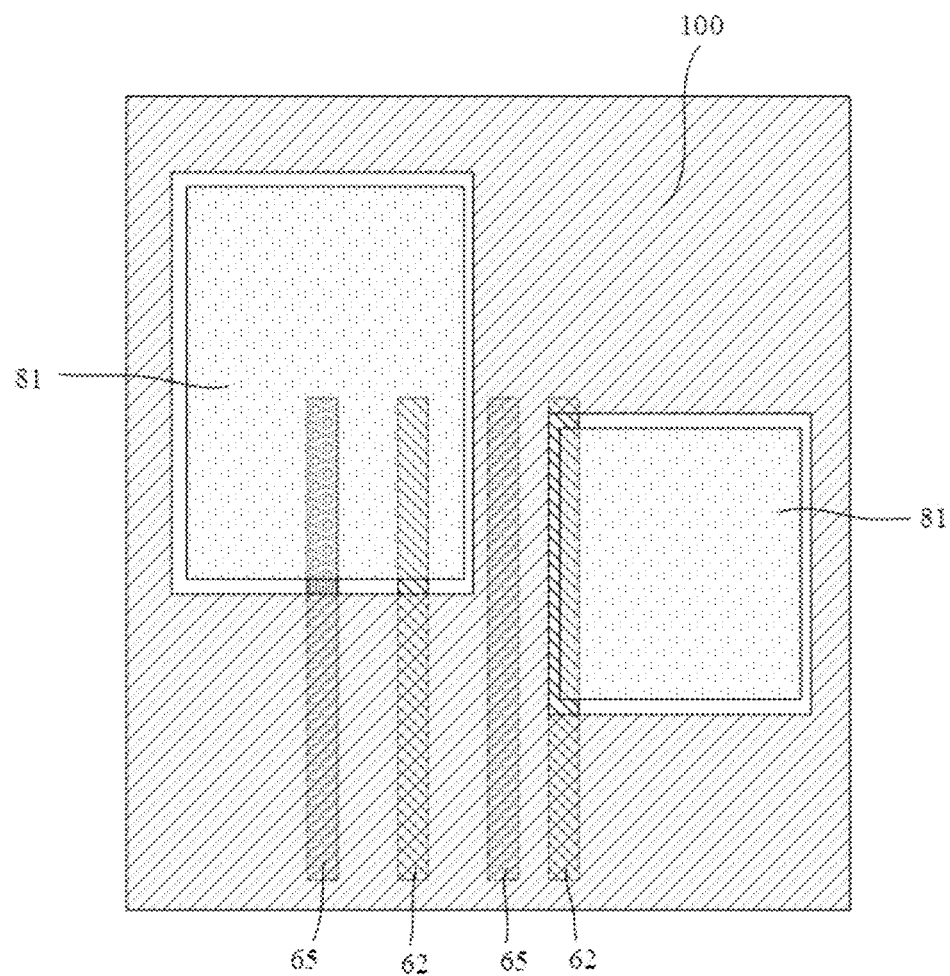
FIG. 23 is a partial enlarged view of a portion, between two sub-pixels, of the display panel according to some exemplary embodiments of the present disclosure.

FIG. 21 is a schematic cross-sectional view of the display panel according to some exemplary embodiments of the present disclosure taken along line CC' in FIG. 8. FIG. 22 is a schematic cross-sectional view of the display panel according to some exemplary embodiments of the present disclosure taken along line DD' in FIG. 8. FIG. 23 is a partial enlarged view of a portion, between two sub-pixel units, of the display panel according to some exemplary embodiments of the present disclosure.

It should be noted that in order to clearly show the relative positional relationship of the light shielding portion, some structures and film layers are omitted in FIG. 21 to FIG. 23, for example, only one thin film transistor is shown in FIG. 21, and the thin film transistor may be the light-emitting control thin film transistor T6 as shown in FIG. 6.

With reference to FIG. 21 and FIG. 22 in combination, the display panel may include: an active layer 20 on the base substrate 1, a gate insulating layer 30 on a side of the active layer 20 away from the base substrate 1, a gate electrode G6 and a second capacitor electrode Cst2 on a side of the gate insulating layer 30 away from the base substrate 1, a first interlayer insulating layer 40 on a side of the gate electrode G6 and the second capacitor electrode Cst2 away from the base substrate 1, a first capacitor electrode Cst1 on a side of the first interlayer insulating layer 40 away from the base substrate 1, a second interlayer insulating layer 41 on a side of the first capacitor electrode Cst1 away from the base substrate 1, a source electrode S6 and a drain electrode D6 on a side of the second interlayer insulating layer 41 away from the base substrate 1, a first planarization layer 50 covering the source electrode S6 and the drain electrode D6. The source electrode S6 and the drain electrode D6 are respectively connected to the active layer 20 through via holes.

The active layer 20, the gate electrode G6, the source electrode S6 and the drain electrode D6 form the light-emitting control thin film transistor T6. The first capacitor electrode Cst1 and the second capacitor electrode Cst2 are opposite to each other, and are spaced apart by the first interlayer insulating layer 40 to form a storage capacitor Cst.

The display panel may further include: a conductive connecting portion 70 on a side of the first planarization layer 50 away from the base substrate 1, a second planarization layer 51 on a side of the conductive connecting portion 70 away from the base substrate 1, an anode 81 of the OLED on a side of the second planarization layer 51 away from the base substrate 1, and a pixel defining layer 90 on a side of the anode 81 away from the base substrate 1. It should be understood that the OLED may also include an organic light-emitting layer and a cathode on a side of the anode 81 away from the base substrate 1. The anode 81 is electrically connected to the conductive connecting portion 70 through a via hole 811, and the conductive connecting portion 70 is electrically connected to the drain electrode D6 through a via hole 701, that is, the anode 81 is electrically connected to the drain electrode D6 via the conductive connecting portion 70.

In the examples shown in the drawings, the second capacitor electrode Cst2 and the gate electrode G6 are located in the same layer, for example, formed by the same patterning process. For the convenience of description, the layer where the second capacitor electrode Cst2 and the gate electrode G6 are located may be referred to as a first conductive layer. The first capacitor electrode Cst1 is located between the first conductive layer and the conductive layer where the source electrode S6 and the drain electrode D6 are located. For the convenience of description, the layer where the first capacitor electrode Cst1 is located may be referred to as a second conductive layer, and the layer where the source electrode S6 and the drain electrode D6 are located may be referred to as a third conductive layer. The conductive connecting portion 70 is located on a side of the third conductive layer away from the base substrate 1, for the convenience of description, the layer where the conductive connecting portion 70 is located may be referred to as a fourth conductive layer.

In the embodiments of the present disclosure, the aforementioned various signal lines 61, 62, 63, 64, 65, 66, and 67 may be respectively located on at least one conductive layer selected from the first conductive layer, the second conductive layer, the third conductive layer, and the fourth conductive layer. For example, the scanning signal line 61 and the previous scanning signal line 62 may be located in the first conductive layer, the light-emitting control line 63 may be located in the second conductive layer, the data line 64 and the driving voltage line 65 may be located in the third conductive layer, the initialization voltage line 66 may be located in the fourth conductive layer. However, the embodiments of the present disclosure are not limited to this, a signal line may also be located in a plurality of conductive layers, for example, some driving voltage lines 65 may be located in the third conductive layer, and some other driving voltage lines 65 may be located in the fourth conductive layer.

For example, the first conductive layer and the second conductive layer may be conductive layers made of the gate material, and the third conductive layer and the fourth conductive layer may be conductive layers made of the source/drain material.

For example, the gate material may include metal materials, such as Mo, Al, Cu, other metals and alloys thereof.

The source/drain material may include metal materials, such as Mo, Al, Cu, other metals and alloys thereof. The semiconductor material constituting the active layer may include, for example, amorphous silicon, polysilicon, an oxide semiconductor, etc., and the oxide semiconductor material may include, for example, IGZO (Indium Gallium Zinc Oxide), ZnO (Zinc Oxide), etc.

In the illustrated embodiments, the light shielding portion 100 is provided in the fourth conductive layer, that is, the light shielding portion 100 and the conductive connecting portion 70 are located in the same layer. For example, both the light shielding portion 100 and the conductive connecting portion 70 may include the source/drain material and formed by the same patterning process.

In this way, in order to form the light shielding portion, no additional film layers need to be added, and no additional patterning processes need to be added, thereby facilitating the manufacturing process and saving manufacturing costs.

It should be understood that the light shielding portion 100 provided in the fourth conductive layer is not continuously provided to avoid other structures in the fourth conductive layer, such as the conductive connecting portion 70 and some signal lines in the fourth conductive layer.

Optionally, the display panel may include a first buffer layer 11 on the base substrate 1. The first buffer layer 11 may be located between the base substrate 1 and the active layer 20.

With reference to FIG. 8 and FIG. 21 to FIG. 23, the orthographic projection of the light shielding portion 100 on the base substrate 1 at least covers orthographic projections of the gaps between the plurality of signal lines (including the gaps 71 and 72 as mentioned above) on the base substrate 1.

Optionally, the orthographic projection of the light shielding portion 100 on the base substrate 1 overlaps the orthographic projections of the portions of the plurality of signal lines in the second display region AA2 on the base substrate 1, and the orthographic projection of the light shielding portion 100 on the base substrate 1 also overlaps the orthographic projections of the plurality of thin film transistors T1~T7 and the storage capacitor Cst in the second display region AA2 on the base substrate 1.

By providing the light shielding portion in the fourth conductive layer, both the gaps inside respective sub-pixel units and the gaps between any two ones of the signal lines located between the sub-pixel units may be shielded, thereby avoiding the diffraction and interference of the light for imaging.

Optionally, with reference to FIG. 21 and FIG. 23, the orthographic projection of the light shielding portion 100 on the base substrate 1 does not overlaps an orthographic projection of the anode 81 on the base substrate 1. For example, the anode 81 may be made of a light shielding material such as Ag, that is, the anode 81 may also serve to shield the light. In this way, an occupied area of the light shielding portion 100 may be reduced.

Continuing to refer to FIG. 21 and FIG. 23, the orthographic projection of the light shielding portion 100 on the base substrate 1 and the orthographic projection of the anode 81 on the base substrate 1 are spaced apart from each other, that is, there is a certain interval between the orthographic projection of the light shielding portion 100 on the base substrate 1 and the orthographic projection of the anode 81 on the base substrate 1. In this way, the light shielding portion 100 does not overlap the anode 81, so that a crosstalk phenomenon caused by the overlap between the light shielding portion 100 and the anode 81 may be reduced or avoided.

It should be understood that the orthographic projection of the light shielding portion 100 on the base substrate 1 does not overlap most of the orthographic projection of the light transmittance region TRA between any two ones of the pixel units P2 in the second display region AA2 on the base substrate 1. In this way, there is still a large area of the light transmittance region TRA between any two ones of the pixel units P2 in the second display region AA2, so that the light for imaging may pass through the light transmittance region TRA to be incident onto the image sensor 2 provided in the second display region AA2.

Continuing to refer to FIG. 21, the light shielding portion 100 is electrically connected to the driving voltage line 65. With reference to FIG. 6 and FIG. 21 in combination, the driving voltage line 65 is used to supply the ELVDD voltage signal. That is to say, the light shielding portion 100 is also used to supply the ELVDD voltage signal.

Specifically, with reference to FIG. 21, the driving voltage line 65 is electrically connected to the light shielding portion 100 through a via hole 653. With reference to FIG. 6 and FIG. 21 in combination, the driving voltage line 65 is also electrically connected to the second capacitor electrode Cst2, for example, the driving voltage line 65 is electrically connected to the second capacitor electrode Cst2 through a via hole 652. The via hole 653 may penetrate the first planarization layer 50 to expose a part of the driving voltage line 65. The via hole 652 may penetrate the first interlayer insulating layer 40, the first capacitor electrode Cst1, and the second interlayer insulating layer 41 to expose a part of the second capacitor electrode Cst2.

In this way, the light shielding portion 100 is electrically connected to a stable DC voltage signal, and the electric charge generated due to the floating of the light shielding portion 100 may be avoided, so that the ESD phenomenon may be prevented. In addition, both the light shielding portion 100 and the driving voltage line 65 are used as signal lines for supplying the ELVDD voltage signal, so that the IR Drop effect may be effectively reduced, thereby achieving the effect of compensating for brightness uniformity.

Figure 24:
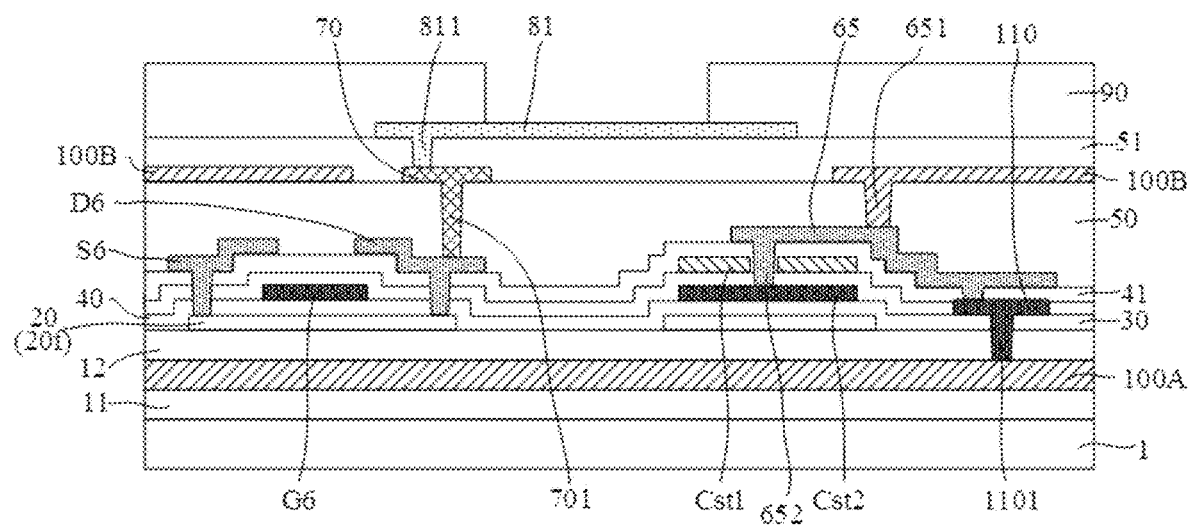
FIG. 24 is a schematic cross-sectional view of the display panel according to some exemplary embodiments of the present disclosure taken along line CC' in FIG. 8.
Figure 25:
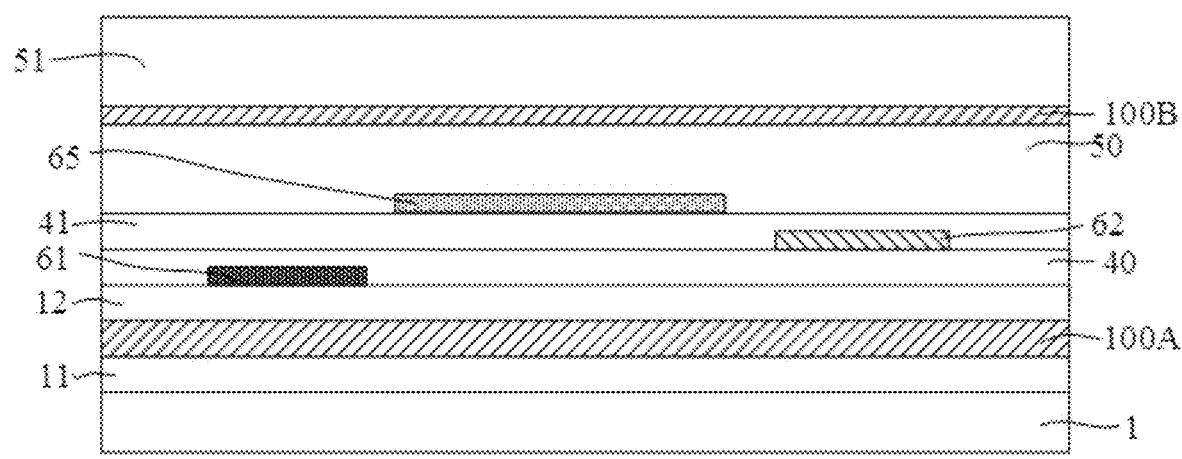
FIG. 25 is a schematic cross-sectional view of the display panel according to some exemplary embodiments of the present disclosure taken along line DD' in FIG. 8.

FIG. 24 is a schematic cross-sectional view of the display panel according to some exemplary embodiments of the present disclosure taken along line CC' in FIG. 8. FIG. 25 is a schematic cross-sectional view of the display panel according to some exemplary embodiments of the present disclosure taken along line DD' in FIG. 8. With reference to FIG. 24 and FIG. 25, the display substrate may include two light shielding portions, that is, a first light shielding portion 100A and a second light shielding portion 100B. The first light shielding portion 100A may be the light shielding portion in the embodiments as shown in FIG. 15 and FIG. 16, and the second light shielding portion 100B may be the light shielding portion in the embodiments as shown in FIG. 21 and FIG. 22. That is to say, the light shielding portions in the above embodiments may be used in combination to ensure a better light shielding effect.

As shown in FIG. 24 and FIG. 25, the first light shielding portion 100A may be a film layer that is separately provided, and it is provided under the active layer 20 and located between the first buffer layer 11 and the second buffer layer 12. The second light shielding portion 100B may be located in the fourth conductive layer, that is, it is located in the same layer as the conductive connecting portion 70.

Both the first light shielding portion 100A and the second light shielding portion 100B may be electrically connected to the driving voltage line 65.

It should be understood that the film layers, positions and connection relationships shown in FIG. 24 and FIG. 25 may be referred to the above descriptions, and will not be repeated here.

Referring back to FIG. 2, at least some embodiments of the present disclosure also provide a display device. The display device may include the display panel and the image sensor 2 (for example, a camera) as described above.

As described above, the display panel includes a first display region and a second display region, and a pixel density of the first display region is greater than a pixel density of the second display region. The image sensor 2 is located on a side of the base substrate 1 away from the pixel array, and a photosensitive surface of the image sensor 2 faces the display panel. The orthographic projection of the image sensor 2 on the base substrate 1 overlaps the orthographic projection of the second display region on the base substrate 1, for example, is located within the orthographic projection of the second display region on the base substrate 1. Thus, light passing through the second display region may be used for imaging, thereby realizing the function of an under-screen camera.

The image sensor 2 may adopt a structure known in the art, for example, including a complementary metal oxide semiconductor (CMOS) image sensor or a charge coupled device (CCD) image sensor. The image sensor 2 may be electrically connected to an image processor. In addition to the image sensor, an imaging module including the image sensor may, for example, further includes a lens assembly, so as to achieve a better imaging effect. The lens assembly and the image sensor may be arranged along an optical axis of the lens assembly in sequence in a direction perpendicular to the base substrate 1.

The display device may include any device or product with a display function. For example, the display device may be a smart phone, a mobile phone, an e-book reader, a desktop computer (PC), a laptop PC, a netbook PC, a personal digital assistant (PDA), a portable multimedia player (PMP), a digital audio player, a mobile medical device, a camera, a wearable device (such as a head-mounted device, electronic clothing, an electronic bracelet, an electronic necklace, an electronic accessory, an electronic tattoo, or a smart watch), a television, etc.

Although some embodiments of the general technical concept of the present disclosure have been shown and described, those skilled in the art will understand that variations may be made to these embodiments without departing from the principle and spirit of the general technical concept, thus the scope of the present disclosure shall be defined by the claims and their equivalents.

The invention claimed is:

1. A display panel, comprising a first display region and a second display region at least partially surrounded by the first display region; the display panel comprising:
   a base substrate;
   a plurality of pixel units arranged on a side of the base substrate, wherein each pixel unit comprises a pixel driving circuit and a light-emitting element, the pixel driving circuit is configured to drive the light-emitting element, and the plurality of pixel units comprise a plurality of first pixel units in the first display region and a plurality of second pixel units in the second display region;
   a plurality of signal lines, the plurality of signal lines being electrically connected to pixel driving circuits of the plurality of second pixel units respectively; and
   a light shielding portion on the side of the base substrate,
   wherein orthographic projections of at least two ones of the plurality of signal lines on the base substrate are spaced apart from each other by a gap, and an orthographic projection of the light shielding portion on the base substrate covers an orthographic projection of the gap on the base substrate and orthographic projections of the plurality of second pixel units;
   wherein the light shielding portion comprises a plurality of first light shielding sub-portions, the plurality of first light shielding sub-portions being arranged in an array along a row direction and a column direction, the row direction and the column direction are both parallel to a plane in which the base substrate is located;
   wherein an orthographic projection of one of the plurality of first light shielding sub-portions on the base substrate covers an orthographic projection of a respective one of the plurality of second pixel units on the base substrate;
   wherein in two adjacent rows of first light shielding sub-portions, first light shielding sub-portions in one row and first light shielding sub-portions in the other row are alternately arranged along the row direction; and/or in two adjacent columns of first light shielding sub-portions, first light shielding sub-portions in one column and first light shielding sub-portions in the other column are alternately arranged along the column direction.

2. The display panel according to claim 1, wherein the first display region has a first pixel density, the second display region has a second pixel density, and the first pixel density is larger than the second density.

3. The display panel according to claim 1, wherein the light shielding portion further comprises a plurality of second light shielding sub-portions, the plurality of first light shielding sub-portions are connected as an integral structure through at least one of the plurality of second light shielding sub-portions, and orthographic projections of the plurality of second light shielding sub-portions on the base substrate cover orthographic projections of the plurality of signal lines in the second display region on the base substrate.

4. The display panel according to claim 3, wherein in two adjacent rows of first light shielding sub-portions, a spacing between two adjacent first light shielding sub-portions in one row along the row direction is substantially equal to a spacing between two adjacent first light shielding sub-portions in the other row along the row direction; and/or
   wherein in two adjacent columns of first light shielding sub-portions, a spacing between two adjacent first light shielding sub-portions in one column along the column direction is substantially equal to a spacing between two adjacent first light shielding sub-portions in the other column along the column direction.

5. The display panel according to claim 1, wherein two adjacent first light shielding sub-portions in the column direction are connected as an integral structure through at least one of the plurality of second light shielding sub-portions.

6. The display panel according to claim 5, wherein in an $N^{th}$ row of first light shielding sub-portions and an $(N+1)^{th}$ row of first light shielding sub-portions, first light shielding sub-portions in the $N^{th}$ row and first light shielding sub-portions in the $(N+1)^{th}$ row are sequentially connected as an integral structure through more than one second light shielding sub-portion, wherein N is an odd number.

7. The display panel according to claim 1, wherein in any two adjacent rows of first light-shielding sub-portions, first light-shielding sub-portions in one row and first light-shielding sub-portions in the other row are sequentially connected as an integral structure through more than one second light shielding sub-portion.

8. The display panel according to claim 4, wherein in the two adjacent rows of first light shielding sub-portions, first light shielding sub-portions in one row and first light shielding sub-portions in the other row are arranged adjacent to each other along the column direction respectively; and/or
in the two adjacent columns of first light shielding sub-portions, first light shielding sub-portions in one column and first light shielding sub-portions in the other column are arranged adjacent to each other along the row direction respectively.

9. The display panel according to claim 8, wherein the two adjacent first light shielding sub-portions in the column direction are connected as an integral structure through at least one of the plurality of second light shielding sub-portions; and/or
wherein the two adjacent first light shielding sub-portions in the row direction are connected to as an integral structure through at least one of the plurality of second light shielding sub-portions.

10. The display panel according to claim 6, wherein an orthographic projection of the first light shielding sub-portion on the base substrate is substantially in a shape of a trapezoid with curved side edges.

11. The display panel according to claim 10, wherein in the $(N+1)^{th}$ row of first light shielding sub-portions, the first light shielding sub-portion has a first notch, the first notch is located on a side edge of the first light shielding sub-portion close to the $N^{th}$ row of first light shielding sub-portions, and the first notch is recessed in a direction away from the $N^{th}$ row of first light shielding sub-portions.

12. The display panel according to claim 7, further comprising a plurality of light transmittance regions in the second display region, orthographic projections of the plurality of light transmittance regions on the base substrate do not overlap the orthographic projection of the light shielding portion on the base substrate, and an orthographic projection of each of the plurality of light transmittance regions on the base substrate has a rectangular shape with rounded corners.

13. The display panel according to claim 9, wherein a profile of an orthographic projection of a first light shielding sub-portion on the base substrate has an approximately rectangular shape, and the approximately rectangular shape has an arc-shaped transition at each of four corners.

14. The display panel according to claim 13, wherein a second light shielding sub-portion between two adjacent first light shielding sub-portions in the row direction is in a shape of a straight line extending along the row direction; and/or
wherein the second light shielding sub-portion between two adjacent first light shielding sub-portions in the column direction is in a shape of a straight line extending along the column direction.

15. The display panel according to claim 14, wherein for the first light shielding sub-portion and the second light shielding sub-portion connected to each other,
one end of the second light shielding sub-portion is connected to a side edge of the first light shielding sub-portion at a position approximately at a midpoint of the side edge of the first light shielding sub-portion connected to the second light shielding sub-portion; and/or
the first light shielding sub-portion has a second notch on each of opposite side edges in the column direction, and the second notch is recessed toward a center of the first light shielding sub-portion in the column direction; and/or
the first light shielding sub-portion has a third notch on each of opposite side edges in the row direction, and the third notch is recessed toward the center of the first light shielding sub-portion in the row direction.

16. The display panel according to claim 1, wherein a profile of an orthographic projection of the light shielding portion on the base substrate has an arc-shaped boundary line; and/or a profile of the orthographic projection of the light shielding portion on the base substrate is arc-shaped at corners;
wherein the light shielding portion is arranged between the base substrate and the plurality of pixel units.

17. The display panel according to claim 1, wherein the display panel is provided with a plurality of gaps, and the plurality of gaps comprises a first sub-gap and a second sub-gap, the first sub-gap is located inside the second pixel unit in the second display area, and the second sub-gap is located between the plurality of second pixel units in the second display area; and
wherein the orthographic projection of the light shielding portion on the substrate covers an orthographic projection of the first sub-gap on the substrate and an orthographic projection of the second sub-gap on the substrate.

18. A display device, comprising:
the display panel according to claim 1; and
an image sensor,
wherein the image sensor is located on a side of the base substrate away from the light shielding portion, and an orthographic projection of the image sensor on the base substrate falls within the orthographic projection of the second display region on the base substrate.

* * * * *